(12) United States Patent
Konrath et al.

(10) Patent No.: US 11,677,023 B2
(45) Date of Patent: Jun. 13, 2023

(54) SEMICONDUCTOR DEVICE

(71) Applicant: Infineon Technologies Austria AG, Villach (AT)

(72) Inventors: Jens Peter Konrath, Villach (AT); Georg Pfusterschmied, Vienna (AT); Gregor Pobegen, Villach (AT); Ulrich Schmid, Vienna (AT); Fabian Triendl, Vienna (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 6 days.

(21) Appl. No.: 17/307,243

(22) Filed: May 4, 2021

(65) Prior Publication Data
US 2022/0359748 A1 Nov. 10, 2022

(51) Int. Cl.
*H01L 29/78* (2006.01)
*H01L 29/66* (2006.01)
*H01L 29/16* (2006.01)
*H01L 29/872* (2006.01)

(52) U.S. Cl.
CPC ...... *H01L 29/7827* (2013.01); *H01L 29/1608* (2013.01); *H01L 29/66143* (2013.01); *H01L 29/66666* (2013.01); *H01L 29/872* (2013.01); *H01L 29/8725* (2013.01)

(58) Field of Classification Search
CPC ............... H01L 29/872; H01L 29/7813; H01L 29/1608; H01L 29/8725; H01L 29/7827; H01L 29/66666; H01L 29/66143
See application file for complete search history.

(56) References Cited

U.S. PATENT DOCUMENTS

| | | | | |
|---|---|---|---|---|
| 6,362,495 B1 * | 3/2002 | Schoen | ............... | H01L 29/1608 257/77 |
| 7,078,780 B2 * | 7/2006 | Wu | ...................... | H01L 29/8725 257/155 |
| 7,186,609 B2 * | 3/2007 | Korec | .................. | H01L 27/0817 257/E29.338 |
| 7,217,950 B2 * | 5/2007 | Kaneko | ............... | H01L 29/7802 257/E29.081 |
| 7,754,550 B2 * | 7/2010 | Chiola | ................ | H01L 29/6606 438/770 |
| 7,781,802 B2 * | 8/2010 | Yamagami | .......... | H01L 21/0465 257/199 |
| 8,704,295 B1 * | 4/2014 | Darwish | ............... | H01L 29/872 257/334 |
| 8,766,279 B1 * | 7/2014 | Yen | ...................... | H01L 29/1608 257/77 |
| 8,912,621 B1 * | 12/2014 | Chuang | ............. | H01L 29/66143 257/471 |

(Continued)

*Primary Examiner* — Bilkis Jahan
*Assistant Examiner* — Victor V Barzykin
(74) *Attorney, Agent, or Firm* — Cooper Legal Group, LLC

(57) ABSTRACT

A semiconductor device and a method of manufacturing a semiconductor are provided. In an embodiment, a first trench is formed in a silicon carbide layer. A second trench is formed in the silicon carbide layer to define a mesa in the silicon carbide layer between the first trench and the second trench. A first doped semiconductor material is formed in the first trench and a second doped semiconductor material is formed in the second trench. A third doped semiconductor material is formed over the mesa to define a heterojunction at an interface between the third doped semiconductor material and the mesa.

21 Claims, 14 Drawing Sheets

(56) References Cited

U.S. PATENT DOCUMENTS

| | | | |
|---|---|---|---|
| 8,999,854 B2* | 4/2015 | Masuda | H01L 29/66068 |
| | | | 438/735 |
| 9,111,852 B2* | 8/2015 | Aketa | H01L 29/1608 |
| 9,318,624 B2* | 4/2016 | Zhang | H01L 29/0684 |
| 9,577,118 B2* | 2/2017 | Aketa | H01L 29/872 |
| 9,941,112 B2* | 4/2018 | Ogasawara | H01L 21/02123 |
| 10,566,426 B2* | 2/2020 | Mauder | H01L 29/7802 |
| 10,593,668 B2* | 3/2020 | Siemieniec | H01L 29/36 |
| 11,063,142 B2* | 7/2021 | Konrath | H01L 29/7813 |
| 11,121,265 B2* | 9/2021 | Seok | H01L 29/6606 |
| 11,355,651 B2* | 6/2022 | Aketa | H01L 29/8725 |
| 2002/0125541 A1* | 9/2002 | Korec | H01L 29/872 |
| | | | 257/E29.338 |
| 2005/0009255 A1* | 1/2005 | Chiola | H01L 21/32105 |
| | | | 438/173 |
| 2005/0230744 A1* | 10/2005 | Wu | H01L 29/872 |
| | | | 257/329 |
| 2006/0211227 A1* | 9/2006 | Chen | H01L 29/872 |
| | | | 438/581 |
| 2008/0191304 A1* | 8/2008 | Zhang | H01L 27/0814 |
| | | | 257/E27.068 |
| 2009/0026532 A1* | 1/2009 | Schilling | H01L 29/7813 |
| | | | 257/E21.409 |
| 2011/0254010 A1* | 10/2011 | Zhang | H01L 29/7813 |
| | | | 438/137 |
| 2012/0205772 A1* | 8/2012 | Chen | H01L 29/0623 |
| | | | 438/570 |
| 2012/0256195 A1* | 10/2012 | Aketa | H01L 29/1095 |
| | | | 257/77 |
| 2012/0261751 A1* | 10/2012 | Chao | H01L 21/3086 |
| | | | 257/E29.256 |
| 2013/0062723 A1* | 3/2013 | Henning | H01L 29/0619 |
| | | | 257/E29.338 |
| 2013/0130482 A1* | 5/2013 | Masuda | H01L 29/8613 |
| | | | 438/507 |
| 2014/0145289 A1* | 5/2014 | Zhang | H01L 29/6606 |
| | | | 257/475 |
| 2014/0225126 A1* | 8/2014 | Aketa | H01L 21/30604 |
| | | | 257/77 |
| 2014/0312472 A1* | 10/2014 | Ogasawara | H01L 21/02123 |
| | | | 257/644 |
| 2015/0287775 A1* | 10/2015 | Marui | H01L 29/1608 |
| | | | 257/493 |
| 2015/0333190 A1* | 11/2015 | Aketa | H01L 29/408 |
| | | | 257/77 |
| 2016/0260844 A1* | 9/2016 | Quddus | H01L 29/8725 |
| 2016/0276452 A1* | 9/2016 | Konrath | H01L 29/6606 |
| 2017/0040423 A1* | 2/2017 | Inoue | H01L 29/78 |
| 2018/0175150 A1* | 6/2018 | Mauder | H01L 21/02252 |
| 2020/0098936 A1* | 3/2020 | Seok | H01L 29/165 |
| 2020/0203513 A1* | 6/2020 | Konrath | H01L 29/0696 |
| 2020/0273987 A1* | 8/2020 | Zeng | H01L 29/66734 |
| 2020/0328312 A1* | 10/2020 | Weng | H01L 29/8725 |
| 2021/0013310 A1* | 1/2021 | Leendertz | H01L 29/66734 |
| 2021/0359117 A1* | 11/2021 | Pfirsch | H01L 29/66348 |
| 2022/0052152 A1* | 2/2022 | Lichtenwalner | H01L 29/0623 |
| 2022/0059709 A1* | 2/2022 | Cooper | H01L 29/0619 |

* cited by examiner

SEMICONDUCTOR DEVICE

TECHNICAL FIELD

The present disclosure relates to semiconductor devices, for example to silicon carbide (SiC) semiconductor devices and manufacturing methods therefore.

BACKGROUND

Semiconductor devices including diodes include a heterojunction at an interface between a substrate material and a junction material.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a semiconductor device is provided. The semiconductor device comprises a silicon carbide layer comprising a mesa, a first doped region layer adjacent a first side of the mesa, a second doped region adjacent a second side of the mesa, a third doped region over the mesa, and a heterojunction defined at an interface between the third doped region and the mesa.

According to some embodiments, a semiconductor device is provided. The semiconductor device comprises a first layer having a first band gap comprising a mesa, a first region adjacent a first side of the mesa and having a first material composition different than a second material composition of the first layer, a second region adjacent a second side of the mesa and having a third material composition different than the second material composition of the first layer, a second layer comprising a second material having a second band gap less than the first band gap over the first layer, and a heterojunction defined at an interface between the first layer and the second layer.

According to some embodiments, a method for forming a semiconductor device is provided. The method comprises forming a first trench in a silicon carbide layer. A second trench is formed in the silicon carbide layer to define a mesa in the silicon carbide layer between the first trench and the second trench. A first doped semiconductor material is formed in the first trench and a second doped semiconductor material is formed in the second trench. A third doped semiconductor material is formed over the mesa to define a heterojunction at an interface between the third doped semiconductor material and the mesa.

According to some embodiments, the first doped region, the second doped region, and the third doped region are contiguous in that they are formed from a semiconductor layer formed in the first trench, in the second trench, and over the mesa. In some embodiments, a dopant concentration of the first doped region, the second doped region, and the third doped region may be the same, such as an n++ concentration.

According to some embodiments, an apparatus is provided. The apparatus includes means for forming a first trench in a silicon carbide layer. The apparatus includes means for forming a second trench in the silicon carbide layer to define a mesa in the silicon carbide layer between the first trench and the second trench. The apparatus includes means for forming a first doped semiconductor material in the first trench. The apparatus includes means for forming a second doped semiconductor material in the second trench. The apparatus includes means for forming a third doped semiconductor material over the mesa to define a heterojunction at an interface between the third doped semiconductor material and the mesa To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 10 schematically illustrates acts of manufacturing a semiconductor device according to various examples.

DETAILED DESCRIPTION

Figure 1A:
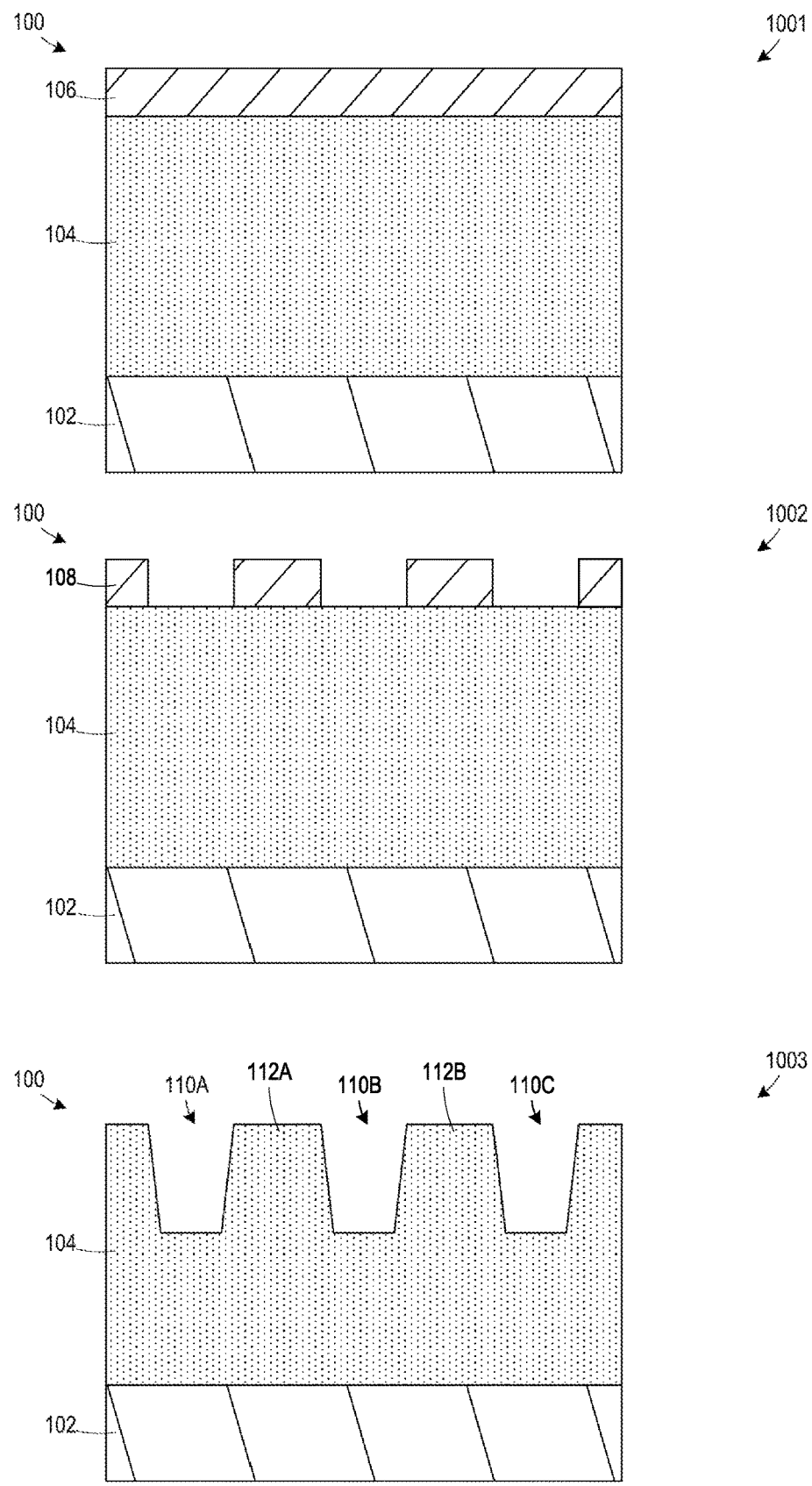
FIG. 1A schematically illustrates acts of manufacturing a semiconductor device according to various examples.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6° or at most 4°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

In accordance with the present disclosure, a semiconductor device and a method of manufacturing the semiconductor device are provided. The semiconductor device may comprise doped semiconductor material formed in trenches and over a mesa defined between adjacent trenches. The doping profile of the semiconductor material may be varied to affect the forward current and leakage current of the device.

According to some embodiments, a semiconductor device is provided. The semiconductor device comprises a silicon carbide layer comprising a mesa, a first doped region adjacent a first side of the mesa, a second doped region adjacent a second side of the mesa, a third doped region over the mesa, and a heterojunction defined at an interface between the third doped region and the mesa.

According to some embodiments, the first doped region comprises a first impurity having a first conductivity type, the second doped region comprises a second impurity having the first conductivity type, and the third doped region comprises a third impurity having a second conductivity type opposite the first conductivity type.

According to some embodiments, the third doped region is over at least one of the first doped region or the second doped region.

According to some embodiments, the third doped region comprises a first portion adjacent the first side of the mesa, a second portion adjacent the second side of the mesa, and a third portion over the first doped region, the second doped region, and the mesa.

According to some embodiments, a first conductive contact contacts the first doped region and the first portion of the third doped region and a second conductive contact contacts the second doped region and the second portion of the third doped region.

According to some embodiments, a conductive layer is over the third doped region and contacts the first conductive contact and the second conductive contact.

According to some embodiments, the first doped region, the second doped region, and the third doped region comprise an impurity having a first conductivity type.

According to some embodiments, at least one of the first doped region, the second doped region, or the third doped region has a doping profile that varies in a vertical direction.

According to some embodiments, the first doped region has a first impurity concentration, and the second doped region has a second impurity concentration greater than the first impurity concentration.

According to some embodiments, a fourth doped region in the silicon carbide layer is under the first doped region, the second doped region, and the third doped region.

According to some embodiments, a first dielectric region is under the first doped region, a second dielectric region is under the second doped region, and the silicon carbide layer is between the first dielectric region and the second dielectric region.

According to some embodiments, a fourth doped region in the silicon carbide layer is under and directly contacts the first doped region and a fifth doped region in the silicon carbide layer is under and directly contacts the second doped region, the third doped region comprises a first impurity having a first conductivity type, the fourth doped region comprises a second impurity having a second conductivity type opposite the first conductivity type, and the fifth doped region comprises a third impurity having the second conductivity type.

According to some embodiments, the fourth doped region is a current spread layer in the silicon carbide layer. In additional or alternative embodiments, the fourth doped region may be a first blocking region under the first doped region. In some embodiments, the fifth doped region may be a second blocking region under the second doped region. In some embodiments, the fourth doped region directly contacts the first doped region, In some embodiments, the fifth doped region directly contacts the second doped region. In some embodiments, the current spread layer is a sixth doped region in the silicon carbide layer under the fourth doped region and the fifth doped region. In some embodiments, the sixth doped region directly contacts the fourth doped region or the fifth doped region.

According to some embodiments, a semiconductor device is provided. The semiconductor device comprises a first layer having a first band gap comprising a mesa, a first region adjacent a first side of the mesa and having a first material composition different than a second material composition of the first layer, a second region adjacent a second side of the mesa and having a third material composition different than the second material composition of the first layer, a second layer comprising a second material having a second band gap less than the first band gap over the first layer, and a heterojunction defined at an interface between the first layer and the second layer.

According to some embodiments, the first region has a third band gap less than the first band gap and the second region has a fourth band gap less than the first band gap.

According to some embodiments, a first dielectric layer is between the first region and the first layer and a second dielectric layer is between the second region and the first layer.

According to some embodiments, a method for forming a semiconductor device is provided. The method comprises forming a first trench in a silicon carbide layer. A second trench is formed in the silicon carbide layer to define a mesa in the silicon carbide layer between the first trench and the second trench. A first doped semiconductor material is formed in the first trench and a second doped semiconductor material is formed in the second trench. A third doped semiconductor material is formed over the mesa to define a heterojunction at an interface between the third doped semiconductor material and the mesa.

According to some embodiments, the first doped semiconductor material is formed by providing a first impurity having a first conductivity type in the first trench, the second doped semiconductor material is formed by providing a second impurity having the first conductivity type in the second trench, and the third doped semiconductor material is formed by providing a third impurity having a second conductivity type opposite the first conductivity type over the trench. A first conductive contact contacting the first doped semiconductor material and the third doped semiconductor material is formed. A second conductive contact contacting the second doped semiconductor material and the third doped semiconductor material is formed.

According to some embodiments, a first cavity exposes the first doped semiconductor material and the third doped semiconductor material. A second cavity exposes the second doped semiconductor material and the third doped semiconductor material. The first conductive contact and the second conductive contact are formed by forming a conductive barrier layer in the first cavity and in the second cavity.

According to some embodiments, an impurity having the first conductivity type is implanted in a first region under the first trench and in a second region under the second trench.

According to some embodiments, at least one of first doped semiconductor material, the second doped semiconductor material, or the third doped semiconductor material has a doping profile that varies in a vertical direction.

According to some embodiments, a first dielectric layer is formed in a bottom portion of the first trench and a second dielectric layer is formed in a bottom portion of the second trench.

The embodiments described herein may be combined in any way.

Figure 1B:
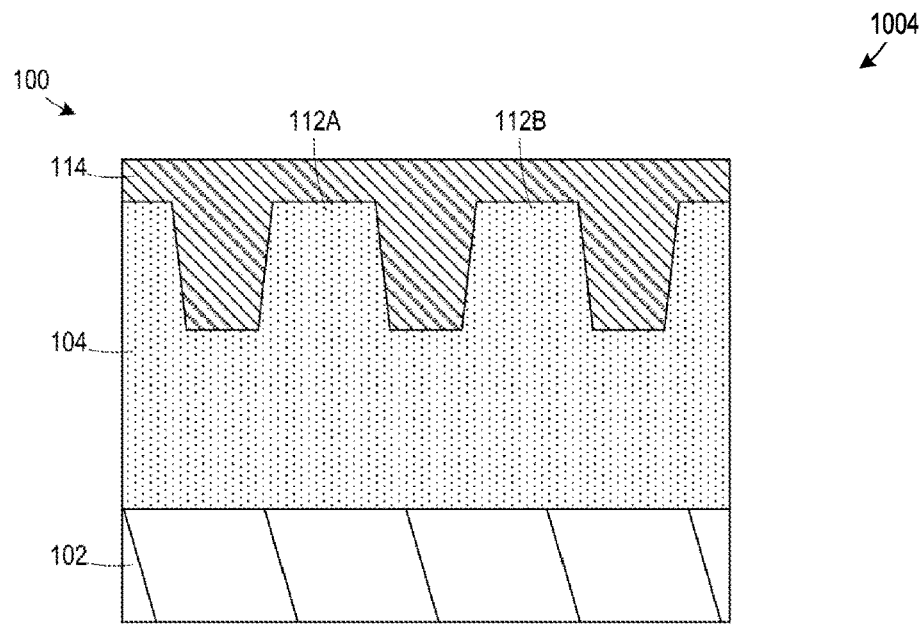
FIG. 1B schematically illustrates acts of manufacturing a semiconductor device according to various examples.
Figure 1B:
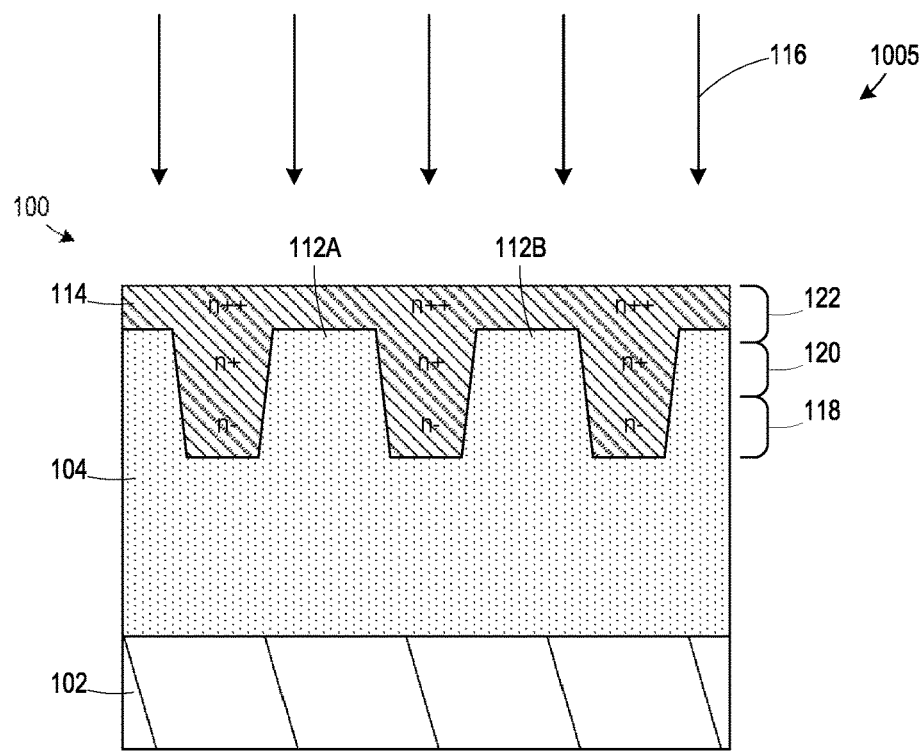
Figure 1C:
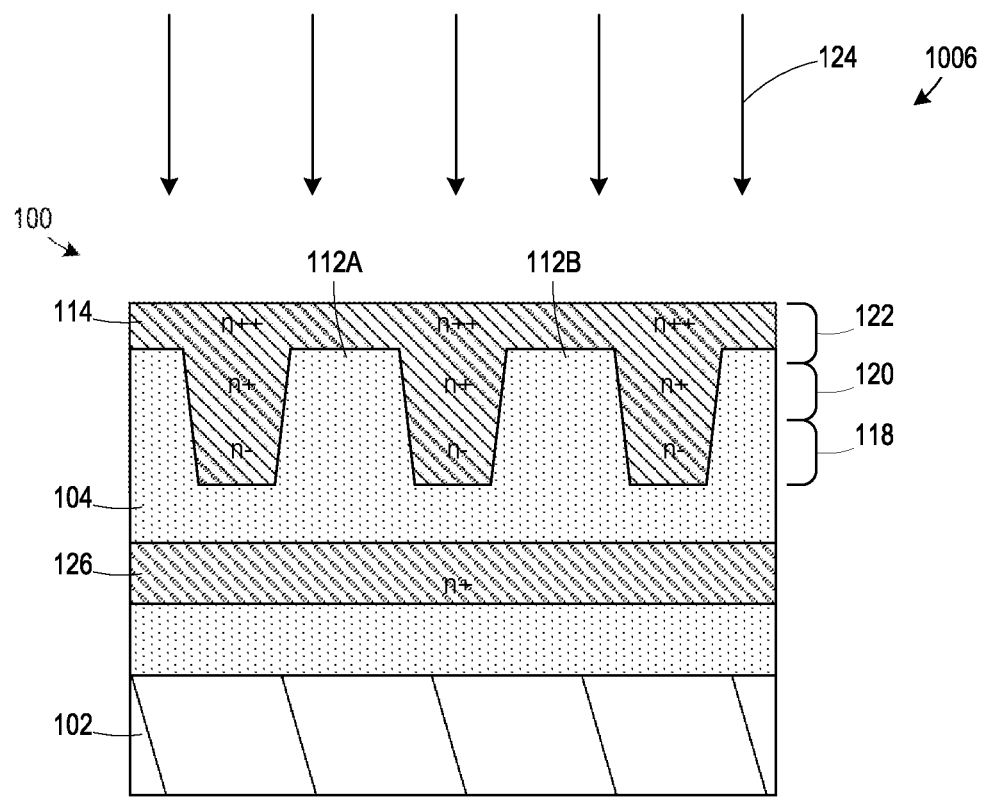
Figure 1C:
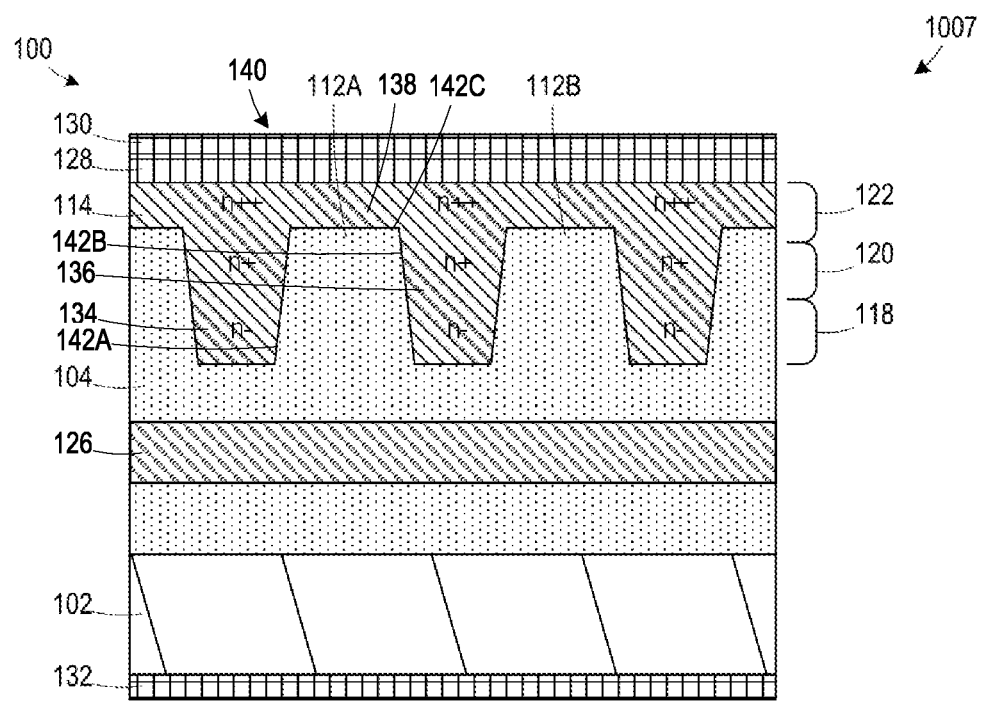

FIGS. 1A-1C illustrate aspects with respect to manufacturing a semiconductor device 100 according to various examples of the present disclosure. At 1001 (illustrated in FIG. 1A), the semiconductor device 100 comprises a semiconductor body 102, a drift layer 104 formed over the semiconductor body 102, and a mask layer 106 formed over the drift layer 104.

In some embodiments, the semiconductor body 102 comprises crystalline semiconductor material. The semiconductor substrate 102 may comprise silicon carbide (SiC) and/or other semiconductor compounds. The semiconductor body 102 may comprise dopants (e.g., nitrogen (N), phosphorus (P), beryllium (Be), boron (B), aluminum (Al), gallium (Ga) and/or other dopants). Alternatively and/or additionally, the semiconductor body 102 may comprise impurities (e.g., hydrogen, fluorine, oxygen and/or other impurities). The semiconductor body 102 may comprise a hexagonal phase of silicon carbide, e.g., 4H—SiC. The <0001> crystal axis may be tilted by an off-axis angle α to a surface normal the first surface. The <11-20> crystal axis may be tilted by the off-axis angle α with respect to the horizontal plane. The <1-100> crystal axis may be orthogonal to the cross-sectional plane. The off-axis angle α may be in a range from 2° to 8°. For example, the off-axis angle α may be 4°.

In some embodiments, an epitaxial growth process is performed to form the drift layer 104 using the semiconductor body 102 as a growth template. The semiconductor body 102 and the drift layer 104 may be a semiconductor material, such as SiC (e.g. having a hexagonal crystal structure), GaN, $Ga_2O_3$, diamond, InP, AlP, a ternary group III-V semiconductor, such as AlGaN, InGaN, InGaP, InAlP, or some other suitable material alone or in combination. In some embodiments, the semiconductor body 102 and the drift layer 104 have a band gap of about 2.4 eV to 3.4 eV. In some embodiments, the semiconductor body 102 and the drift layer 104 have a band gap greater than 2 eV (a so-called wide band gap semiconductor). In some embodiments, the semiconductor body 102 and/or the drift layer 104 comprises an n-type impurity, such as at least one of phosphorous, arsenic, or another suitable n-type dopant provided at an n– concentration.

According to some embodiments, the mask layer 106 comprises a plurality of individually formed layers that together define a mask stack. In some embodiments, the mask layer 106 comprises at least one of a hard mask layer, a bottom antireflective coating (BARC) layer, an organic planarization layer (OPL), or a photoresist layer.

The hard mask layer is formed by at least one of physical vapor deposition (PVD) (e.g., sputtering and/or evaporation), chemical vapor deposition (CVD) (e.g., low pressure CVD (LPCVD), ultrahigh vacuum CVD (UHVCVD), reduced pressure CVD (RPCVD), plasma-enhanced CVD (PECVD) and/or atmospheric pressure CVD (APCVD)), spin on, growth, or other suitable techniques. In some embodiments, the hard mask layer comprises at least one of silicon and oxygen, silicon and nitrogen, nitrogen, silicon (e.g., polycrystalline silicon) or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques, according to some embodiments. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

At 1002 (illustrated in FIG. 1A), the mask layer 106 is patterned to define a mask 108. In some embodiments, the photoresist layer is exposed using a radiation source and a reticle to define a pattern in the photoresist layer and portions of the photoresist layer are removed to define a patterned photoresist layer. The underlying OPL, BARC layer, and hard mask layer are etched using the patterned photoresist layer as a template to form the mask 108 and expose portions of the drift layer 104 under the mask 108.

At 1003 (illustrated in FIG. 1A), trenches 110A, 110B, 110C are formed in the drift layer 104 and mesas 112A, 112B are defined between adjacent trenches 110A, 110B, 110C. An etching processes may be performed to pattern the drift layer 104 using the mask 108 as an etch template to define the trenches 110A, 110B, 110C and mesas 112A, 112B. The etching process comprises at least one of a plasma etching process, a reactive ion etching (RIE) process, or other suitable techniques.

A vertical extension of the trenches 110A, 110B, 110C may be in a range from 0.3 µm to 5 µm, e.g., in a range from 0.5 µm to 2 µm. Sidewalls of the trenches 110A, 110B, 110C may be vertical or may taper with increasing distance from a first surface of the semiconductor body. A width of the trenches 110A, 110B, 110C the plane of the first surface may be in a range from 500 nm to 5 µm, e.g., in a range from 1 µm to 3 µm. For example, a taper angle of the trenches 110A, 110B, 110C with respect to the vertical direction may be equal to the off-axis angle α or may deviate from the off-axis angle α by not more than ±1 degree such that at least a first sidewall of two opposite longitudinal mesa sidewalls is formed by a main crystal plane with high charge carrier mobility, e.g., a {11-2}, a {1-100}, or a {-1100} crystal plane. A second mesa sidewall opposite to the first mesa sidewall may be tilted to a main crystal plane by twice the off-axis angle α, e.g., by 4 degree or more, for example, by about 8 degrees. According to an embodiment the trenches 110A, 110B, 110C and mesas 112A, 112B may be stripe-shaped extending in parallel along a first lateral direction.

At 1004 (illustrated in FIG. 1B), the mask 108 is removed and a semiconductor layer 114 is formed in the trenches 110A, 110B, 110C and over the mesas 112A, 112B. In some embodiments, the semiconductor layer 114 is formed by at least one of CVD (e.g., LPCVD) epitaxy (e.g., VPE, MBE, LPE), growth, or other suitable techniques. In some embodiments, the semiconductor layer 114 comprises silicon, such as polysilicon, or other suitable materials. In some embodiments, the band gap of the semiconductor layer 114 is less than a band gap of the semiconductor body 102. In some embodiments, the semiconductor layer 114 has a band gap of around 1.1 eV. In some embodiments, the semiconductor layer 114 has a band gap less than 2 eV. In some embodiments, the semiconductor layer 114 comprises a cubic crystal structure interfacing with the crystal structure (e.g., a hexagonal crystal structure) of the drift layer 104, where heterojunctions are defined at the interfaces. In some embodiments, a planarization process, such as chemical mechanical planarization (CMP), is performed to planarize the semiconductor layer 114.

At 1005 (illustrated in FIG. 1B), one or more implantation processes 116 are performed to provide an impurity in the semiconductor layer 114. In some embodiments, the semiconductor layer 114 comprises an n-type impurity. According to some embodiments, an n– concentration of the impurity in the semiconductor layer 114 is provided in situ during the formation of the semiconductor layer 114. In some embodiments, the implantation process 116 provides a vertical dopant profile that varies throughout the semiconductor layer 114. For example, portions of the semiconductor layer 114 in a lower region 118 of the trenches 110A, 110B, 110C may have an n– concentration, portions of the semiconductor layer 114 in an intermediate region 120 of the trenches 110A, 110B, 110C may have an n+ concentration, and portions of the semiconductor layer 114 in an upper region 122 that includes the portion of the semiconductor layer 114 over the mesas 112A, 112B may have an n++ concentration. The vertical dopant profile may vary along a linear gradient or a non-linear gradient, such as an exponential, quadratic, square root, or logarithmic gradient, from the n– concentration to the n++ concentration. Alternatively, distinct transitions between different impurity concentrations in the regions 118, 120, 122 may be provided. Different configurations of regions 118, 120, 122 are within the scope of the present disclosure. For example, the conductivity types may be reversed and p-type impurities may be used instead of n-type impurities.

At 1006 (illustrated in FIG. 1C), one or more implantation processes 124 are performed to form a current spread layer 126 in the drift layer 104 under the region 118. In some embodiments, the current spread layer 126 comprises an impurity with the same conductivity type as the semiconductor body 102 and the drift layer 104, such an n-type impurity. According to some embodiments, the current spread layer 126 has an n+ concentration. In some embodiments, the current spread layer 126 compensates for low transverse conductivity of the drift layer 104. One or more anneal processes may be performed to activate the dopants in the semiconductor layer 114 or the current spread layer 126. Different configurations of the current spread layer 126 are within the scope of the present disclosure. For example, the conductivity types may be reversed and p-type impurities may be used instead of n-type impurities.

At 1007 (illustrated in FIG. 1C), a barrier layer 128 is formed over the semiconductor layer 114, a top side conductive layer 130 is formed over the barrier layer 128, and a back side conductive layer 132 is formed over the semiconductor body 102. In some embodiments, the barrier layer 128 comprises a conductive layer that inhibits electromigration of material of the top side conductive layer 130 into the semiconductor layer 114. In some embodiments, the barrier layer 124 comprises TaN, TiN, or other suitable material. In some embodiments, the barrier layer 128, the top side conductive layer 130, and the back side conductive layer 132 are deposited by at least one of CVD, PVD, electroplating, or another suitable process. In some embodiments, the top side conductive layer 130 and the back side conductive layer 132 comprise at least one of AlCu, AlSiCu, Cu, NiPPd, or other suitable material. The top side conductive layer 130 and the back side conductive layer 132 may comprise different materials.

The portion of the semiconductor layer 114 in the trench 110A comprises a first doped region 134 adjacent a first side of the mesa 112A, the portion of the semiconductor layer 114 in the trench 110B comprises a second doped region 136 adjacent a second side of the mesa 112A, and the portion of the semiconductor layer 114 over the mesa 112A comprises a third doped region 138. The first doped region 134, the second doped region 136, the third doped region 138, and the material of the drift layer 104 in the mesa 112A define a diode 140, such as Schottky diode. In some embodiments, the first doped region 134, the second doped region 136, and the third doped region 138 are contiguous in that they are formed from the semiconductor layer 114. In some embodiments, a dopant concentration of the first doped region 134, the second doped region 136, and the third doped region 138 may be the same, such as an n++ concentration. In some embodiments, the current spread layer 128 is a fourth doped region in the drift layer 104. Heterojunctions 142A, 142B, 142C are defined at the interfaces between the first doped region 134, the second doped region 136, the third doped region 138, and the material of the drift layer 104, respectively. The characteristics of the heterojunctions vary depending on the dopant profiles of the first doped region 134, the second doped region 136, and the third doped region 138. The top side conductive layer 130 and the back side conductive layer 132 provide terminals of the diode 140.

Figure 2A:
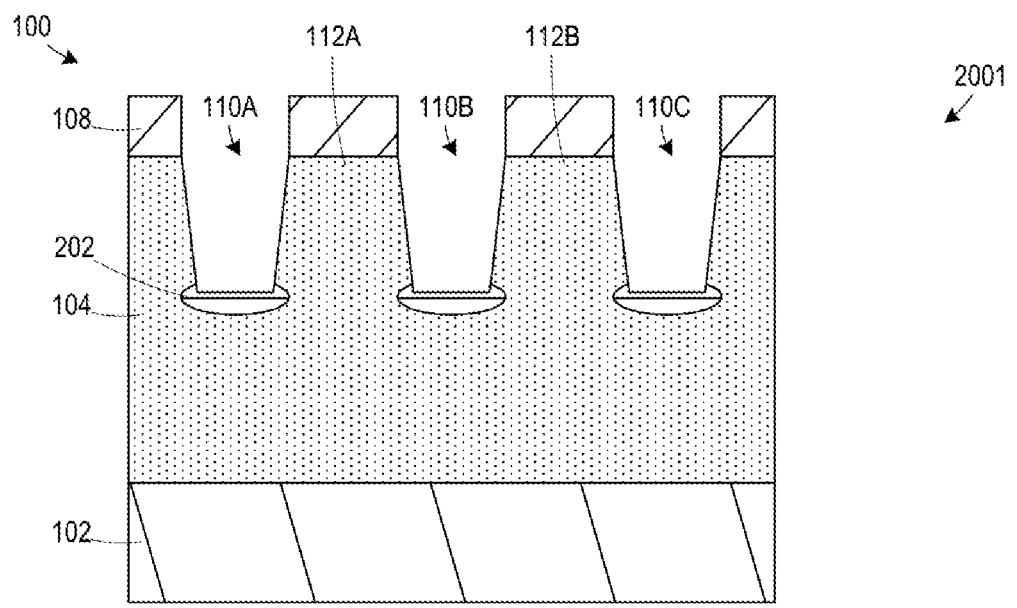
FIG. 2A schematically illustrates acts of manufacturing a semiconductor device according to various examples.
Figure 2A:
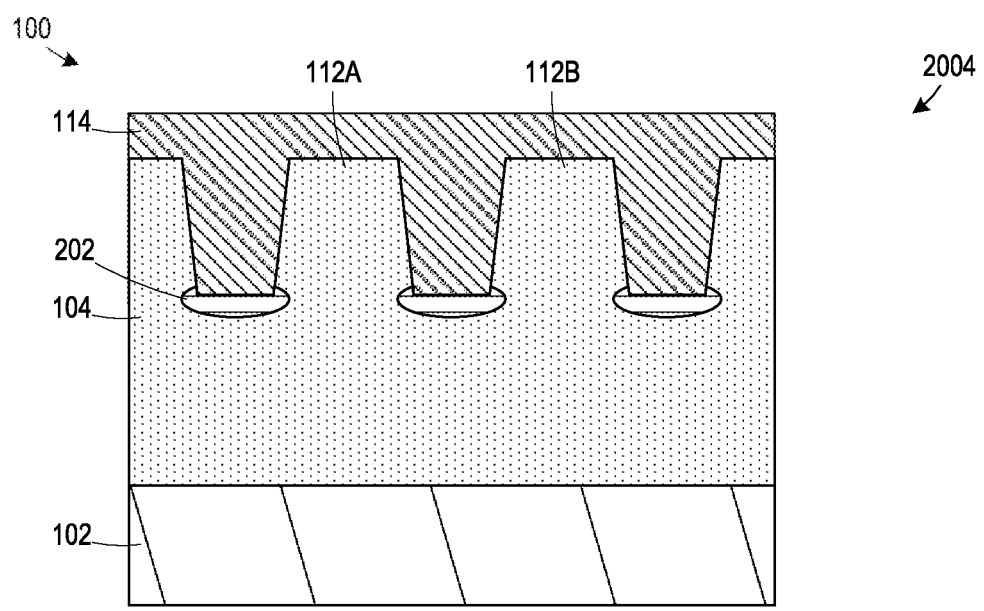
Figure 2B:
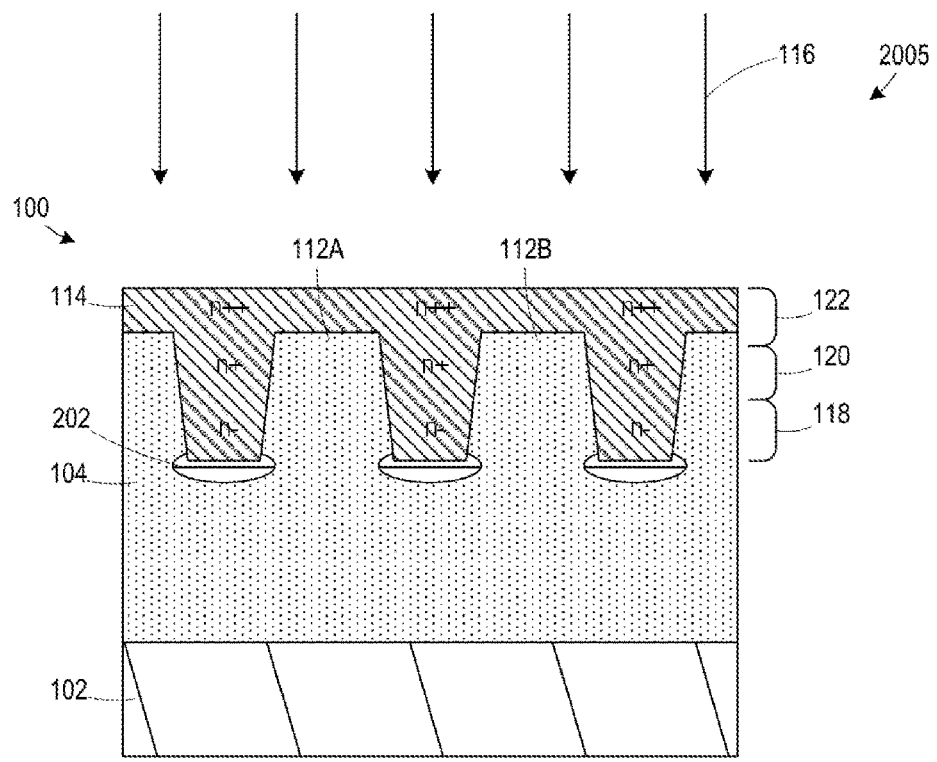
FIG. 2B schematically illustrates acts of manufacturing a semiconductor device according to various examples.
Figure 2B:
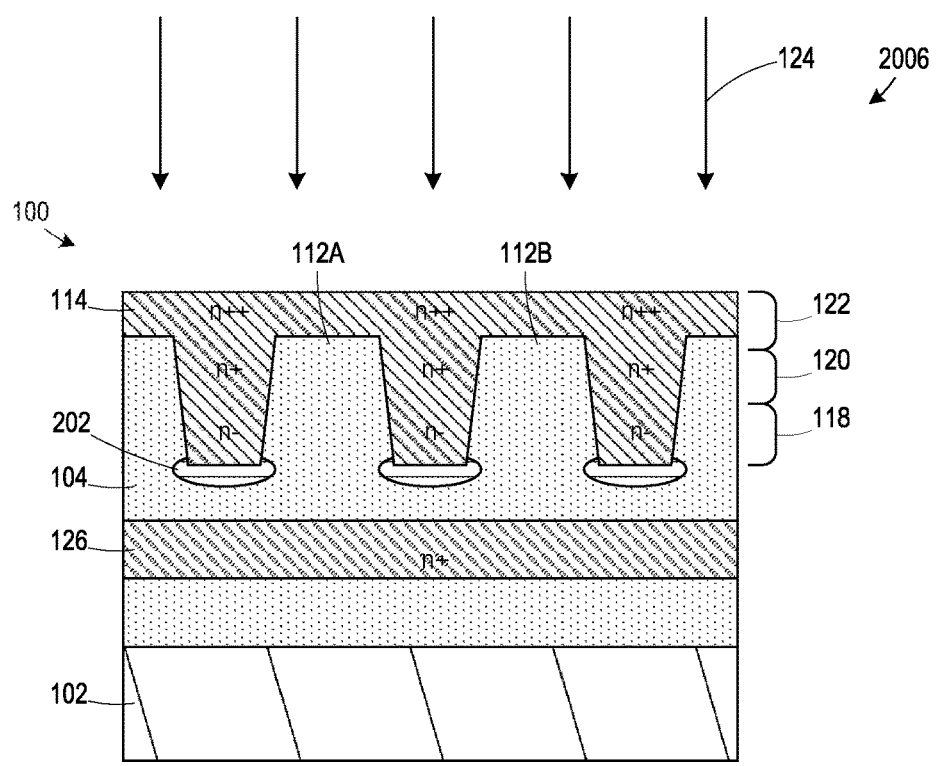
Figure 2C:
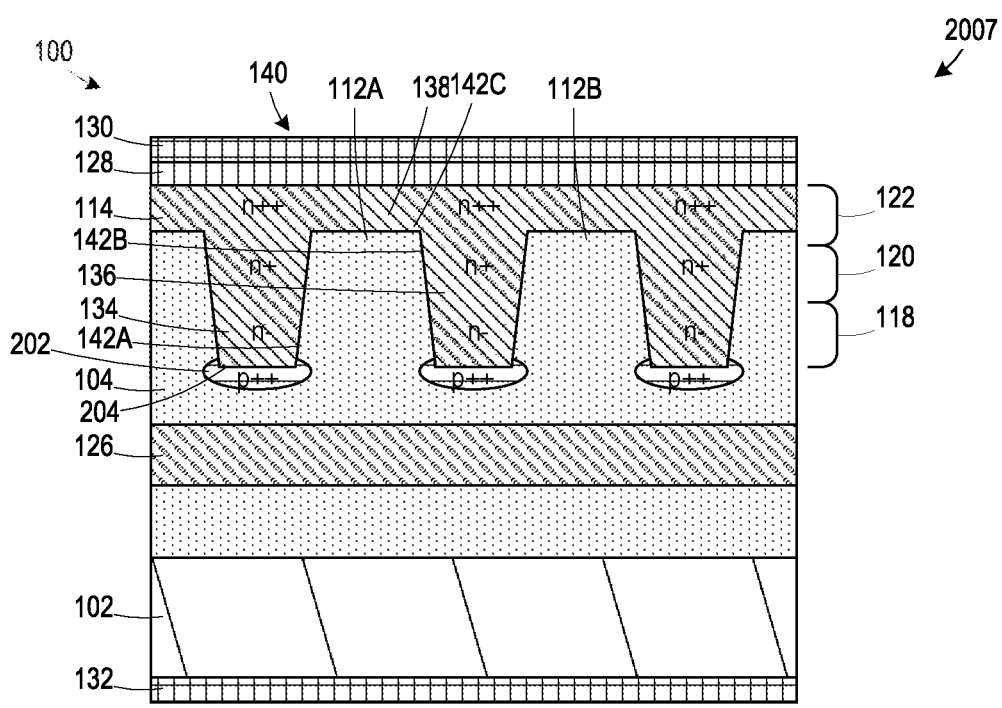
FIG. 2C schematically illustrates acts of manufacturing a semiconductor device according to various examples.

FIGS. 2A-2C illustrate aspects with respect to manufacturing a semiconductor device according to various examples of the present disclosure. One or more acts of FIGS. 2A-2C generally correspond to one or more acts of FIGS. 1A-1C. For example, act 2004 of FIG. 2A may correspond to act 1004 of FIG. 1A. At 2001 (illustrated in FIG. 2A) blocking regions 202 are formed in the drift layer 104 under the trenches 110A, 110B, 110C. In some embodiments, at least one implantation process is performed to form the blocking regions 202. In some embodiments, the implantation process is performed after forming the trenches 110A, 110B, 110C at 1003 prior to removing the mask 108.

At 2004 (illustrated in FIG. 2A), the semiconductor layer 114 is formed in the trenches 110A, 110B, 110C and over the mesas 112A, 112B. In some embodiments, the semiconductor layer 114 is formed by at least one of CVD, LPCVD, epitaxy (e.g., VPE, MBE, LPE), growth, or other suitable techniques. In some embodiments, the semiconductor layer 114 comprises silicon, such as polysilicon, or other suitable materials. In some embodiments, the semiconductor layer 114 has a band gap of around 1.1 eV. In some embodiments, the semiconductor layer 114 has a band gap less than 2 eV. In some embodiments, the semiconductor layer 114 comprises a cubic crystal structure interfacing with the crystal structure (e.g., a hexagonal crystal structure) of the drift layer 104, where heterojunctions are defined at the interfaces. In some embodiments, a planarization process is performed to planarize the semiconductor layer 114.

At 2005 (illustrated in FIG. 2B), one or more implantation processes 116 are performed to provide an impurity in the semiconductor layer 114. In some embodiments, the portion of the semiconductor layer 114 in the trenches 110A, 110B, 110C in the trenches comprises a p-type impurity and the portion of the semiconductor layer 114 over the mesas 112A. According to some embodiments, an n− concentration of the impurity in the semiconductor layer 114 is provided in situ during the formation of the semiconductor layer 114. In some embodiments, the implantation process 116 provides a vertical dopant profile that varies throughout the semiconductor layer 114. For example, portions of the semiconductor layer 114 in a lower region 118 of the trenches 110A, 110B, 110C may have an n− concentration, portions of the semiconductor layer 114 in an intermediate region 120 of the trenches 110A, 110B, 110C may have an n+ concentration, and portions of the semiconductor layer 114 in an upper region 122 that includes the portion of the semiconductor layer 114 over the mesas 112A, 112B may have an n++ concentration. The vertical dopant profile may vary along a linear gradient or a non-linear gradient, such as an exponential, quadratic, square root, or logarithmic gradient, from the n− concentration to the n++ concentration. Alternatively, distinct transitions between different impurity concentrations in the regions 118, 120, 122 may be provided. Different configurations of regions 118, 120, 122 are within the scope of the present disclosure. For example, the conductivity types may be reversed and p-type impurities may be used instead of n-type impurities. In some embodiments, the blocking regions 202 are counter-doped with p-type impurities, such a B, $BF_3$, or other suitable impurities, at a p++ concentration.

At 2006 (illustrated in FIG. 2B), one or more implantation processes 124 are performed to form a current spread layer 126 in the drift layer 104 under the region 118. In some embodiments, the current spread layer 126 comprises an impurity with the same conductivity type as the semiconductor body 102 and the drift layer 104, such an n-type impurity. According to some embodiments, an n+ concentration of the impurity in the current spread layer 126. In some embodiments, the current spread layer 126 compensates for low transverse conductivity of the drift layer 104. One or more anneal processes may be performed to activate the dopants in the semiconductor layer 114 or the current spread layer 126. In some embodiments, the current spread layer 126 overlaps the blocking regions 202. Different configurations of the current spread layer 126 are within the scope of the present disclosure. For example, the conductivity types may be reversed and p-type impurities may be used instead of n-type impurities.

At 2007 (illustrated in FIG. 2C), a barrier layer 128 is formed over the semiconductor layer 114, a top side conductive layer 130 is formed over the barrier layer 128, and a back side conductive layer 132 is formed over the semiconductor body 102. In some embodiments, the barrier layer 128 comprises a conductive layer that inhibits electromigration of material of the top side conductive layer 130 into the semiconductor layer 114. In some embodiments, the barrier layer 128 comprises TaN, TiN, or other suitable material. In some embodiments, the barrier layer 128, the top side conductive layer 130, and the back side conductive layer 132 are deposited by at least one of CVD, PVD, electroplating, or another suitable process. In some embodiments, the top side conductive layer 130 and the back side conductive layer 132 comprise at least one of AlCu, AlSiCu, Cu, NiPPd, or other suitable material. The top side conductive layer 130 and the back side conductive layer 132 may comprise different materials.

The portion of the semiconductor layer 114 in the trench 110A comprises a first doped region 134 adjacent a first side of the mesa 112A, the portion of the semiconductor layer 114 in the trench 110B comprises a second doped region 136 adjacent a second side of the mesa 112A, and the portion of the semiconductor layer 114 over the mesa 112A comprises a third doped region 138. The first doped region 134, the second doped region 136, the third doped region 138, and the material of the drift layer 104 in the mesa 112A define a diode 140, such as Schottky diode. In some embodiments, the first doped region 134, the second doped region 136, and the third doped region 138 are contiguous in that they are formed from the semiconductor layer 114. In some embodiments, a dopant concentration of the first doped region 134, the second doped region 136, and the third doped region 138 may be the same, such as an n++ concentration. In some embodiments, the blocking regions 202 are fourth and fifth doped regions in the drift layer 104 and the current spread layer 128 is a sixth doped region in the drift layer 104. Heterojunctions 142A, 142B, 142C are defined at the interfaces between the first doped region 134, the second doped region 136, the third doped region 138, and the material of the drift layer 104, respectively. The characteristics of the heterojunctions 142A, 142B, 142C vary depending on the dopant profiles of the first doped region 134, the second doped region 136, and the third doped region 138. The top side conductive layer 130 and the back side conductive layer 132 provide terminals of the diode 140.

Figure 3A:
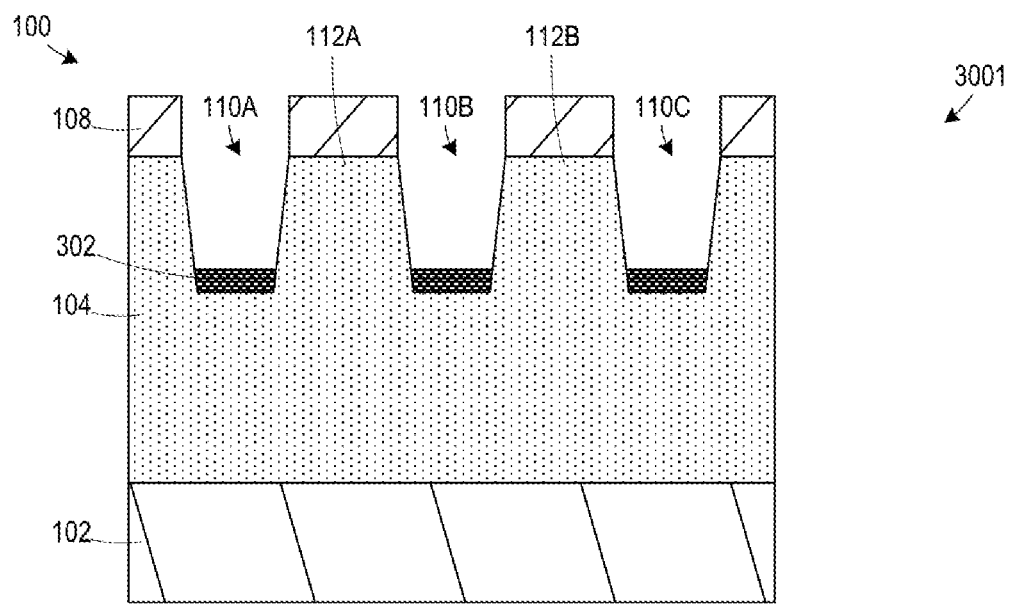
FIG. 3A schematically illustrates acts of manufacturing a semiconductor device according to various examples.
Figure 3A:
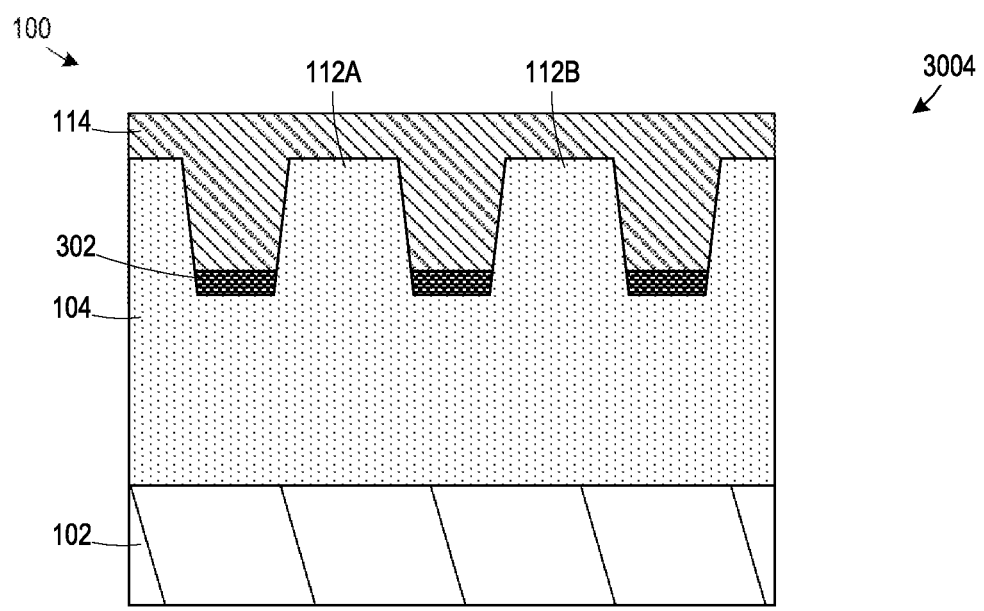
Figure 3B:
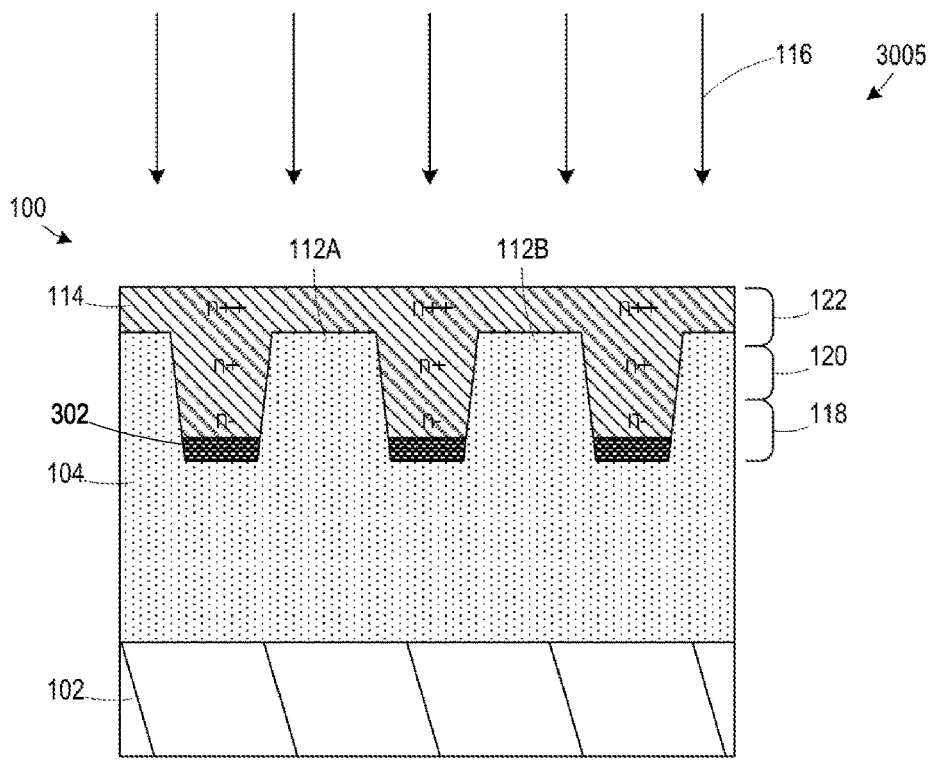
FIG. 3B schematically illustrates acts of manufacturing a semiconductor device according to various examples.
Figure 3B:
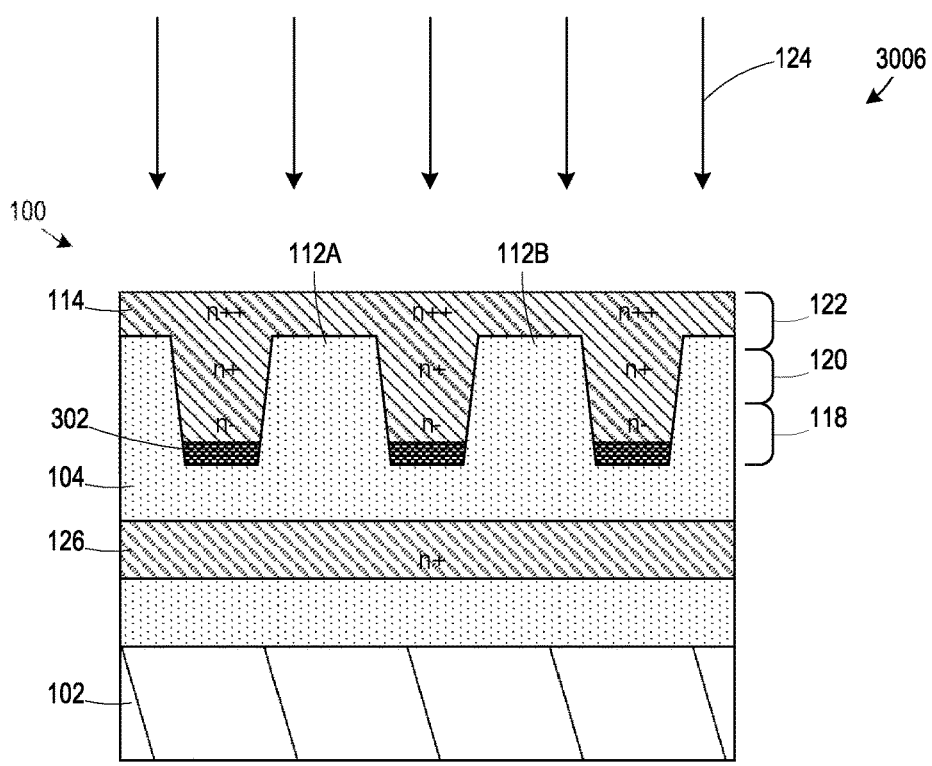
Figure 3C:
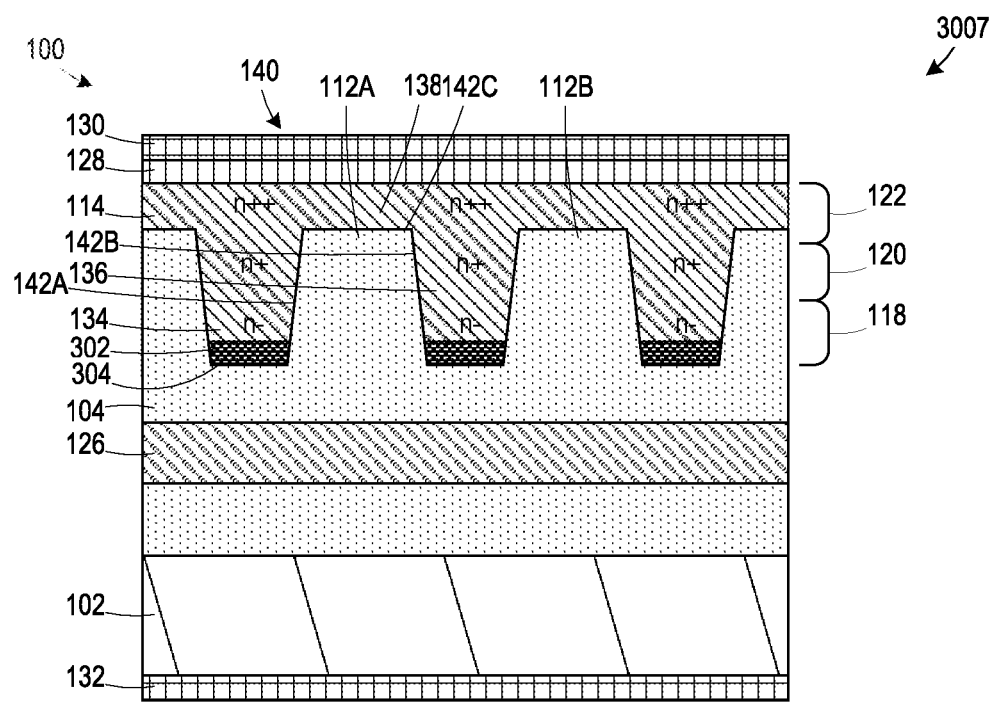
FIG. 3C schematically illustrates acts of manufacturing a semiconductor device according to various examples.

FIGS. 3A-3C illustrate aspects with respect to manufacturing a semiconductor device according to various examples of the present disclosure. One or more acts of FIGS. 3A-3C generally correspond to one or more acts of FIGS. 1A-1C. For example, act 3004 of FIG. 3A may correspond to act 1004 of FIG. 1A. At 3001 (illustrated in FIG. 3A) dielectric layers 302 are formed in bottom portions of the trenches 110A, 110B, 110C. In some embodiments, a deposition process and an etch back process are performed to form the dielectric layers 302. In some embodiments, the dielectric layers 302 comprise silicon and oxygen, silicon and nitrogen, or other suitable materials.

At 3004 (illustrated in FIG. 3A), the semiconductor layer 114 is formed in the trenches 110A, 110B, 110C and over the mesas 112A, 112B. In some embodiments, the semiconductor layer 114 is formed by at least one of CVD, LPCVD, epitaxy (e.g., VPE, MBE, LPE), growth, or other suitable techniques. In some embodiments, the semiconductor layer 114 comprises silicon, such as polysilicon, or other suitable materials. In some embodiments, the semiconductor layer 114 has a band gap of around 1.1 eV. In some embodiments, the semiconductor layer 114 has a band gap less than 2 eV. In some embodiments, the semiconductor layer 114 comprises a cubic crystal structure interfacing with the crystal structure of the drift layer 104 (e.g., a hexagonal crystal structure), where heterojunctions are defined at the interfaces. In some embodiments, a planarization process is performed to planarize the semiconductor layer 114.

At 3005 (illustrated in FIG. 3B), one or more implantation processes 116 are performed to provide an impurity in the semiconductor layer 114. In some embodiments, the semiconductor layer 114 comprises an n-type impurity. According to some embodiments, an n− concentration of the impurity in the semiconductor layer 114 is provided in situ during the formation of the semiconductor layer 114. In some embodiments, the implantation process 116 provides a vertical dopant profile that varies throughout the semiconductor layer 114. For example, portions of the semiconductor layer 114 in a lower region 118 of the trenches 110A, 110B, 110C may have an n− concentration, portions of the semiconductor layer 114 in an intermediate region 120 of the trenches 110A, 110B, 110C may have an n+ concentration, and portions of the semiconductor layer 114 in an upper region 122 that includes the portion of the semiconductor layer 114 over the mesas 112A, 112B may have an n++ concentration. The vertical dopant profile may vary along a linear gradient or a non-linear gradient, such as an exponential, quadratic, square root, or logarithmic gradient, gradient from the n− concentration to the n++ concentration. Alternatively, distinct transitions between different impurity concentrations in the regions 118, 120, 122 may be provided. Different configurations of regions 118, 120, 122 are within the scope of the present disclosure. For example, the conductivity types may be reversed and p-type impurities may be used instead of n-type impurities. In some embodiments, the dielectric layers 302 inhibit a heterojunction from forming at an interface 304 at the bottom of the trenches 110A, 110B, 110C.

At 3006 (illustrated in FIG. 3B), one or more implantation processes 124 are performed to form a current spread layer 126 in the drift layer 104 under the region 118. In some embodiments, the current spread layer 126 comprises a dopant with the same conductivity type as the semiconductor body 102 and the drift layer 104, such an n-type impurity. According to some embodiments, an n+ concentration of the impurity in the current spread layer 126. In some embodiments, the current spread layer 126 compensates for low transverse conductivity of the drift layer 104. One or more anneal processes may be performed to activate the dopants in the semiconductor layer 114 or the current spread layer 126. Different configurations of the current spread layer 126 are within the scope of the present disclosure. For example, the conductivity types may be reversed and p-type impurities may be used instead of n-type impurities.

At 3007 (illustrated in FIG. 3C), a barrier layer 128 is formed over the semiconductor layer 114, a top side conductive layer 130 is formed over the barrier layer 128, and a back side conductive layer 132 is formed over the semiconductor body 102. In some embodiments, the barrier layer 128 comprises a conductive layer that inhibits electromigration of material of the top side conductive layer 130 into the semiconductor layer 114. In some embodiments, the barrier layer 128 comprises TaN, TiN, or other suitable material. In some embodiments, the barrier layer 128, the top side conductive layer 130, and the back side conductive layer 132 are deposited by at least one of CVD, PVD, electroplating, or another suitable process. In some embodiments, the top side conductive layer 130 and the back side conductive layer 132 comprise at least one of AlCu, AlSiCu, Cu, NiPPd, or other suitable material. The top side conductive layer 130 and the back side conductive layer 132 may comprise different materials.

The portion of the semiconductor layer 114 in the trench 110A comprises a first doped region 134 adjacent a first side of the mesa 112A, the portion of the semiconductor layer 114 in the trench 110B comprises a second doped region 136 adjacent a second side of the mesa 112A, and the portion of the semiconductor layer 114 over the mesa 112A comprises a third doped region 138. The first doped region 134, the second doped region 136, the third doped region 138, and the material of the drift layer 104 in the mesa 112A define a diode 140, such as Schottky diode. In some embodiments, the first doped region 134, the second doped region 136, and the third doped region 138 are contiguous in that they are formed from the semiconductor layer 114. In some embodiments, a dopant concentration of the first doped region 134, the second doped region 136, and the third doped region 138 may be the same, such as an n++ concentration. In some embodiments, the current spread layer 128 is a fourth doped region in the drift layer 104. Heterojunctions 142A, 142B, 142C are defined at the interfaces between the first doped region 134, the second doped region 136, the third doped region 138, and the material of the drift layer 104, respectively. The characteristics of the heterojunctions 142A, 142B, 142C vary depending on the dopant profiles of the first doped region 134, the second doped region 136, and the third doped region 138. The top side conductive layer 130 and the back side conductive layer 132 provide terminals of the diode 140.

Figure 4A:
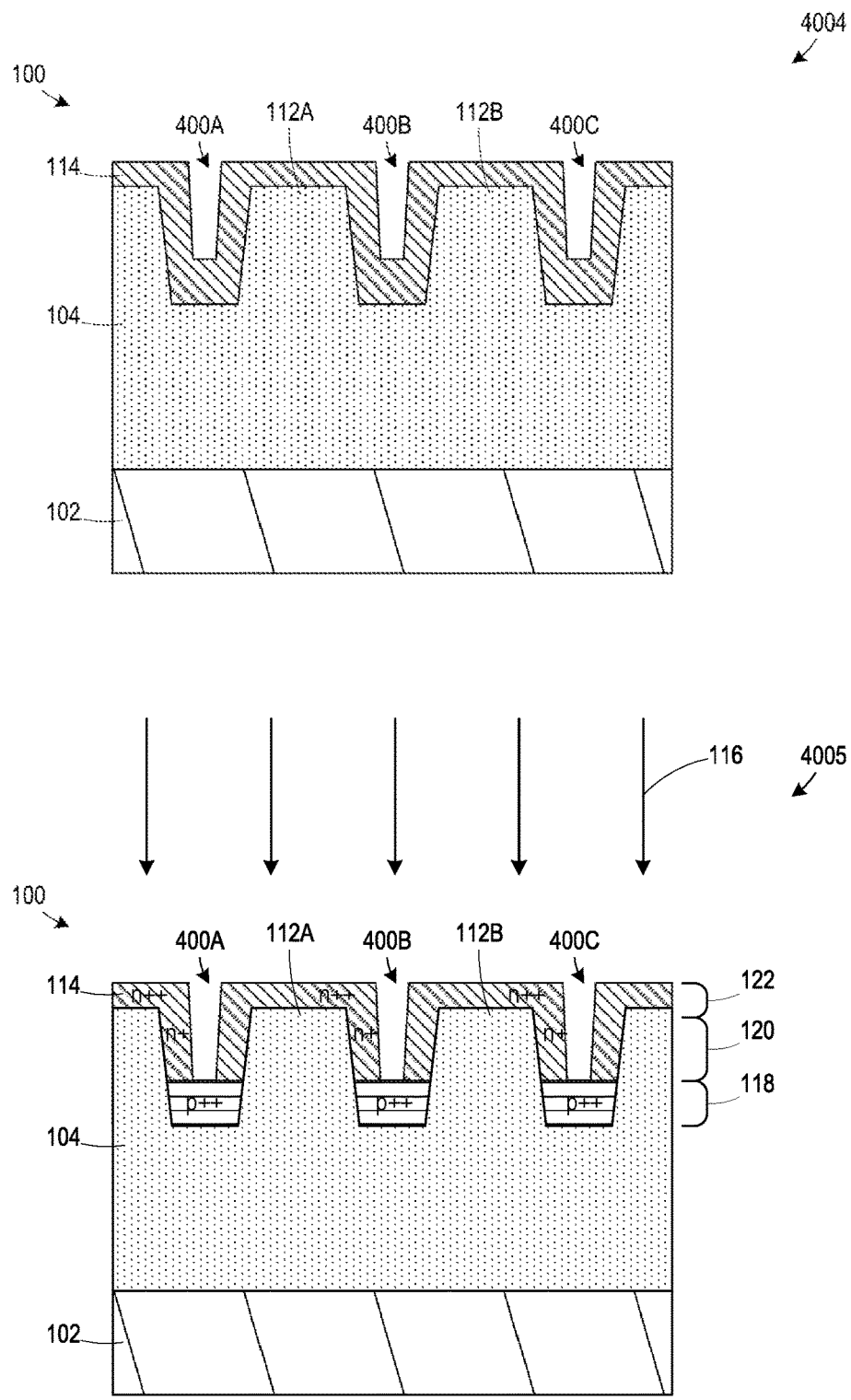
FIG. 4A schematically illustrates acts of manufacturing a semiconductor device according to various examples.
Figure 4B:
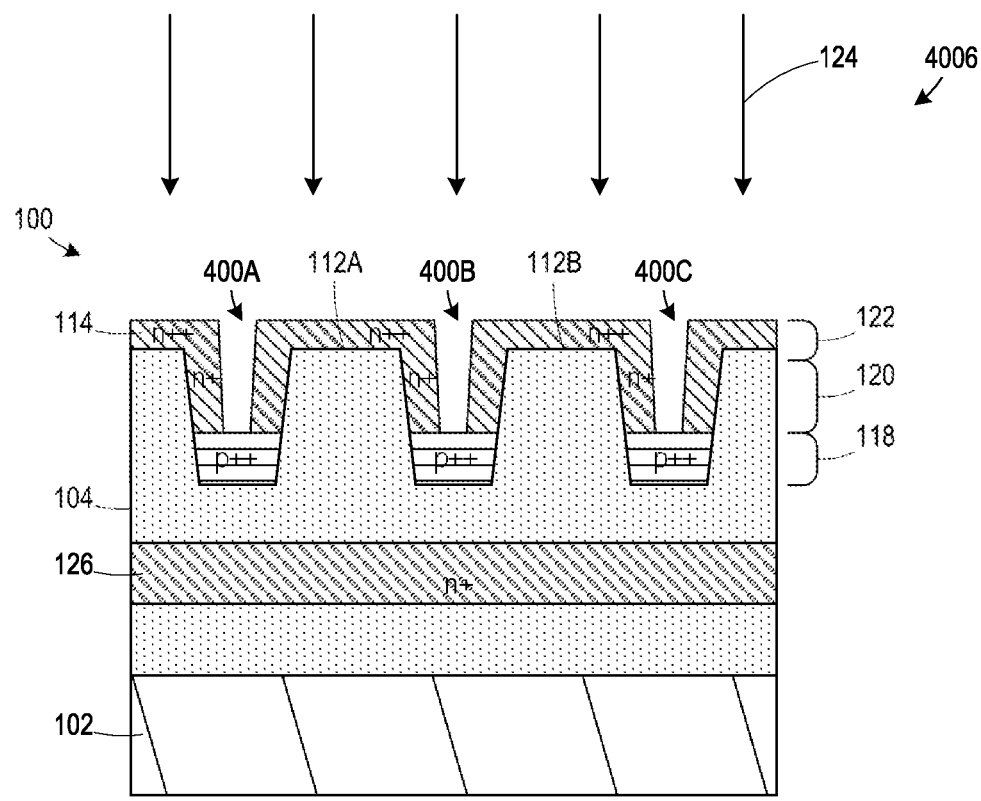
FIG. 4B schematically illustrates acts of manufacturing a semiconductor device according to various examples.
Figure 4B:
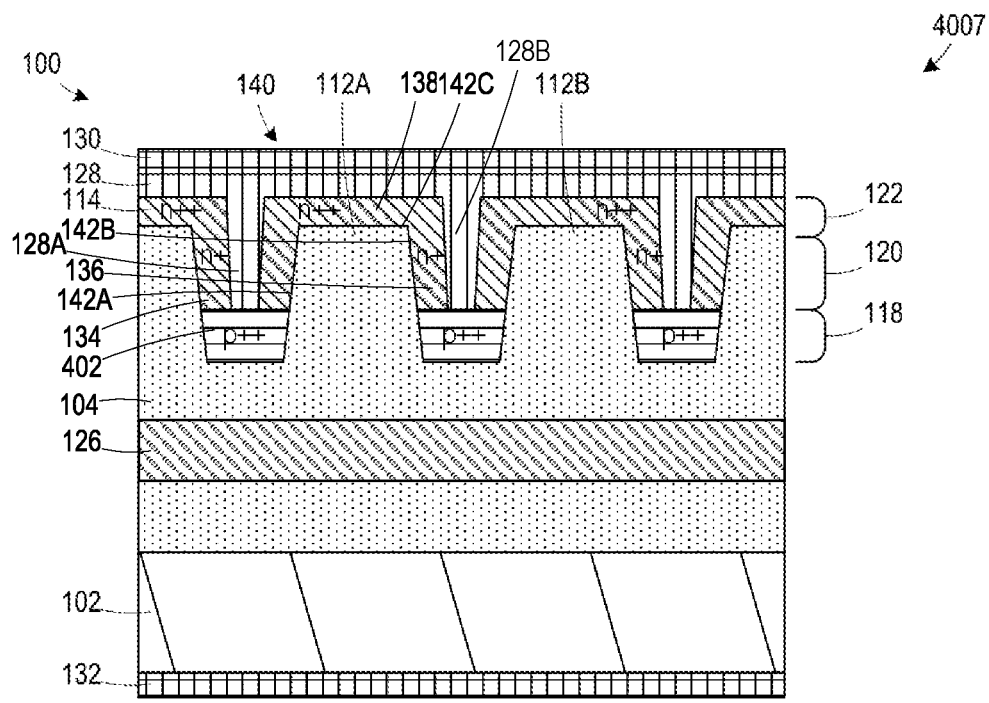

FIGS. 4A-4B illustrate aspects with respect to manufacturing a semiconductor device according to various examples of the present disclosure. One or more acts of FIGS. 4A-4B generally correspond to one or more acts of FIGS. 1A-1C. For example, act 4004 of FIG. 4A may correspond to act 4004 of FIG. 1A. At 4004 (illustrated in FIG. 4A), the semiconductor layer 114 is formed in the trenches 110A, 110B, 110C and over the mesas 112A, 112B without completely filling the trenches 110A, 110B, 110C. In some embodiments, the semiconductor layer 114 is formed by at least one of CVD, LPCVD, epitaxy (e.g., VPE, MBE, LPE), growth, or other suitable techniques. In some embodiments, the semiconductor layer 114 comprises silicon, such as polysilicon, or other suitable materials. In some embodiments, the semiconductor layer 114 has a band gap of around 1.1 eV. In some embodiments, the semiconductor layer 114 has a band gap less than 2 eV. In some embodiments, the semiconductor layer 114 comprises a cubic crystal structure interfacing with the crystal structure (e.g., a hexagonal crystal structure) of the drift layer 104, where heterojunctions are defined at the interfaces. In some embodiments, the process for forming the semiconductor layer 114 is a conformal deposition process that is terminated prior to filling the trenches 110A, 110B, 110C, resulting in cavities 400A, 400B, 400C. In some embodiments, the semiconductor layer 114 is formed to completely fill the trenches 110A, 110B, 110C and an etch process is performed in the presence of mask to remove portions of the semiconductor layer 114 to form the cavities 400A, 400B, 400C.

At 4005 (illustrated in FIG. 3B), one or more implantation processes 116 are performed to provide impurities in the semiconductor layer 114. In some embodiments, the semiconductor layer 114 comprises an n-type impurity. According to some embodiments, an n− concentration of the impurity in the semiconductor layer 114 is provided in situ during the formation of the semiconductor layer 114. In some embodiments, the implantation process 116 provides a vertical dopant profile that varies throughout the semiconductor layer 114. For example, portions of the semiconductor layer 114 in an intermediate region 120 of the trenches 110A, 110B, 110C may have an n+ concentration, and portions of the semiconductor layer 114 in an upper region 122 that includes the portion of the semiconductor layer 114 over the mesas 112A, 112B may have an n++ concentration. The vertical dopant profile may vary along a linear gradient or a non-linear gradient, such as an exponential, quadratic, square root, or logarithmic gradient, gradient from the n− concentration to the n++ concentration. Alternatively, distinct transitions between different impurity concentrations in the regions 118, 120, 122 may be provided. According to some embodiments, at least one implantation process is performed to form counter-doped blocking regions 402 having a p+ or p++ impurity concentration in the lower region 118. Different configurations of regions 118, 120, 122 are within the scope of the present disclosure. For example, the counter-doped blocking regions 402 may fill most or all of the trenches 110A, 110B, 110C, and the n++ portions may be provided over the mesas 112A, 112B. In some embodiments, the n-type impurities and p-type impurities may be reversed.

At 4006 (illustrated in FIG. 4B), one or more implantation processes 124 are performed to form a current spread layer 126 as a fourth doped region in the drift layer 104 under the region 118. In some embodiments, the current spread layer 126 comprises an impurity with the same conductivity type as the semiconductor body 102 and the drift layer 104, such an n-type impurity. According to some embodiments, an n+ concentration of the impurity in the current spread layer 126. In some embodiments, the current spread layer 126 compensates for low transverse conductivity of the drift layer 104. One or more anneal processes may be performed to activate the dopants in the semiconductor layer 114 or the current spread layer 126. Different configurations of the current spread layer 126 are within the scope of the present disclosure. For example, the conductivity types may be reversed and p-type impurities may be used instead of n-type impurities.

At 4007 (illustrated in FIG. 4B), a barrier layer 128 is formed over the semiconductor layer 114 and in the cavities 400A, 400B, 400C, a top side conductive layer 130 is formed over the barrier layer 128, and a back side conductive layer 132 is formed over the semiconductor body 102. In some embodiments, the barrier layer 124 comprises a conductive layer that inhibits electromigration of material of the top side conductive layer 130 into the semiconductor layer 114. The barrier layer 128 defines a first conductive contact 128A and a second conductive contact 128B electrically contacting the blocking regions 402 and the portions of the semiconductor layer doped with n-type impurities, thus avoiding a PN junction between the blocking regions 402 and the semiconductor layer 114. In some embodiments, the barrier layer 124 comprises TaN, TiN, or other suitable material. In some embodiments, the barrier layer 128, the top side conductive layer 130, and the back side conductive layer 132 are deposited by at least one of CVD, PVD, electroplating, or another suitable process. In some embodiments, the top side conductive layer 130 and the back side conductive layer 132 comprise at least one of AlCu, AlSiCu, Cu, NiPPd, or other suitable material. The top side conductive layer 130 and the back side conductive layer 132 may comprise different materials.

The portion of the semiconductor layer 114 in the trench 110A comprises a first doped region 134 adjacent a first side of the mesa 112A, the portion of the semiconductor layer 114 in the trench 110B comprises a second doped region 136 adjacent a second side of the mesa 112A, and the portion of the semiconductor layer 114 over the mesa 112A comprises a third doped region 138. The first doped region 134, the second doped region 136, the third doped region 138, and the material of the drift layer 104 in the mesa 112A define a diode 140, such as Schottky diode. Heterojunctions 142A, 142B, 142C are defined at the interfaces between the first doped region 134, the second doped region 136, the third doped region 138, and the material of the drift layer 104, respectively. The characteristics of the heterojunctions 142A, 142B, 142C vary depending on the dopant profiles of the first doped region 134, the second doped region 136, and the third doped region 138. The top side conductive layer 130 and the back side conductive layer 132 provide terminals of the diode 140.

In some embodiments, the blocking layer 202 of FIG. 2C or the dielectric layer 302 of FIG. 3C may be provided in the device 100 of FIG. 4B.

Figure 5A:
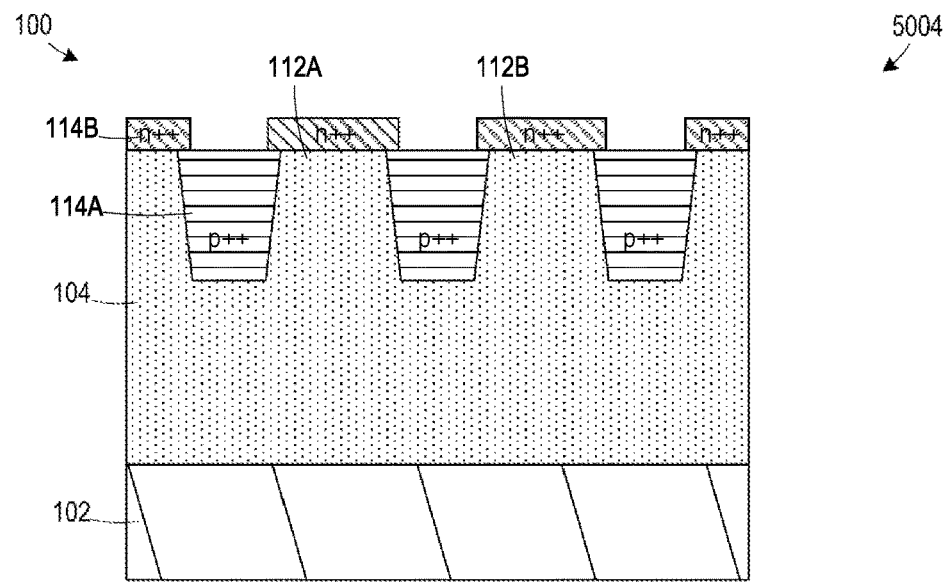
FIG. 5A schematically illustrates acts of manufacturing a semiconductor device according to various examples.
Figure 5A:
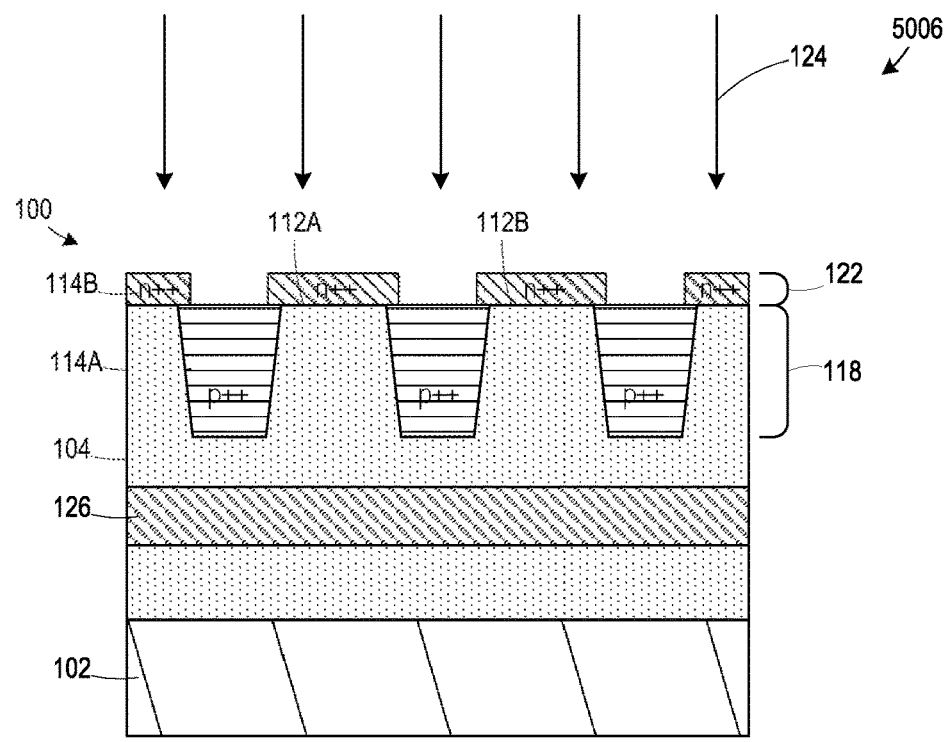
Figure 5B:
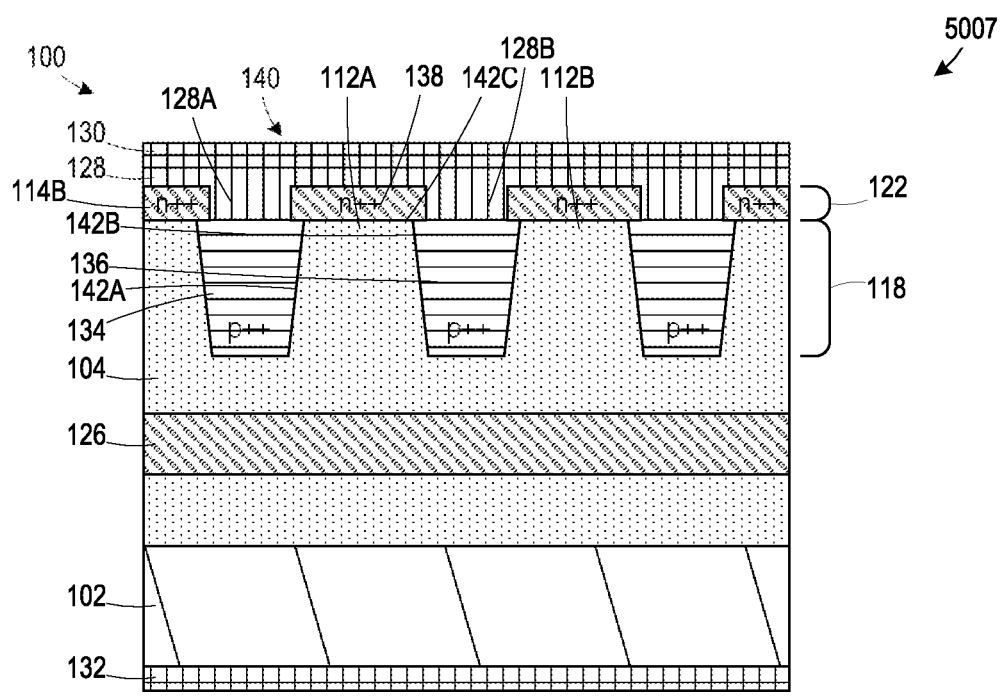
FIG. 5B schematically illustrates acts of manufacturing a semiconductor device according to various examples.

FIGS. 5A-5B illustrate aspects with respect to manufacturing a semiconductor device according to various examples of the present disclosure. One or more acts of FIGS. 5A-5B generally correspond to one or more acts of FIGS. 1A-1C. For example, act 5004 of FIG. 5A may correspond to act 1004 of FIG. 1A. At 5004 (illustrated in FIG. 5A), a first semiconductor layer 114A is formed in the trenches 110A, 110B, 110C and a second semiconductor layer 114B is formed over the mesas 112A, 112B. In some embodiments, the first semiconductor layer 114A and the second semiconductor layer 114B are formed by at least one of CVD, LPCVD, epitaxy (e.g., VPE, MBE, LPE), growth, or other suitable techniques. In some embodiments, at least one of the first semiconductor layer 114A or the second semiconductor layer 114B comprises silicon, such as poly-silicon, or other suitable materials. In some embodiments, at least one of the first semiconductor layer 114A or the second semiconductor layer 114B has a band gap of around 1.1. In some embodiments, at least one of the first semiconductor layer 114A or the second semiconductor layer 114B has a band gap less than 2. In some embodiments, at least one of the first semiconductor layer 114A or the second semiconductor layer 114B comprises a cubic crystal structure interfacing with the crystal structure (e.g., a hexagonal crystal structure) of the drift layer 104, where heterojunctions are defined at the interfaces. In some embodiments, the semiconductor layer 114A is formed by filling the trenches 110A, 110B, 110C and performing a planarization process to remove portion of the semiconductor layer 114A over the drift layer 104. A subsequent deposition process is performed to form the second semiconductor layer 114B over the first semiconductor layer 114A. An etch process is performed in the presence of a mask to remove portions of the semiconductor layer 114B over the mesas 112A, 112B.

In some embodiments, the first semiconductor layer 114A comprises a p-type impurity. According to some embodiments, a p+ or p++ concentration of the impurity in the first semiconductor layer 114A is provided in situ during the formation of the first semiconductor layer 114A. In some embodiments, an implantation process is performed to provide the impurity in the first semiconductor layer 114A. In some embodiments, a vertical dopant profile of the first semiconductor layer 114A varies throughout the first semiconductor layer 114A along a linear or non-linear gradient. According to some embodiments, the second semiconductor layer 114B comprises an n-type impurity having an n++ impurity concentration. In some embodiments, the n-type impurities and the p-type impurities may be reversed.

At 5006 (illustrated in FIG. 5A), one or more implantation processes 124 are performed to form a current spread layer 126 in the drift layer 104 under the region 118. In some embodiments, the current spread layer 126 comprises an impurity with the same conductivity type as the semiconductor body 102 and the drift layer 104, such an n-type impurity. According to some embodiments, an n+ concentration of the impurity in the current spread layer 126. In some embodiments, the current spread layer 126 compensates for low transverse conductivity of the drift layer 104. One or more anneal processes may be performed to activate the dopants in the first semiconductor layer 114A, the second semiconductor layer 114B, or the current spread layer 126. Different configurations of the current spread layer 126 are within the scope of the present disclosure. For example, the conductivity types may be reversed and p-type impurities may be used instead of n-type impurities.

At 5007 (illustrated in FIG. 5B), a barrier layer 128 is formed over the semiconductor layer 114 and in the cavities 400A, 400B, 400C, a top side conductive layer 130 is formed over the barrier layer 128, and a back side conductive layer 132 is formed over the semiconductor body 102. In some embodiments, the barrier layer 124 comprises a conductive layer that inhibits electromigration of material of the top side conductive layer 130 into the first semiconductor layer 114A or the second semiconductor layer 114B. The barrier layer 128 defines a first conductive contact 128A and a second conductive contact 128B electrically contacting the first semiconductor layer 114A and the second semiconductor layer 114B, thus avoiding a PN junction between the first semiconductor layer 114A and the second semiconductor layer 114B. In some embodiments, the barrier layer 128 comprises TaN, TiN, or other suitable material. In some embodiments, the barrier layer 128, the top side conductive layer 130, and the back side conductive layer 132 are deposited by at least one of CVD, PVD, electroplating, or another suitable process. In some embodiments, the top side conductive layer 130 and the back side conductive layer 132 comprise at least one of AlCu, AlSiCu, Cu, NiPPd, or other suitable material. The top side conductive layer 130 and the back side conductive layer 132 may comprise different materials.

The portion of the first semiconductor layer 114A in the trench 110A comprises a first doped region 134 adjacent a first side of the mesa 112A, the portion of the first semiconductor layer 114A in the trench 110B comprises a second doped region 136 adjacent a second side of the mesa 112A, and the portion of the second semiconductor layer 114B over the mesa 112A comprises a third doped region 138. The first doped region 134, the second doped region 136, the third doped region 138, and the material of the drift layer 104 in the mesa 112A define a diode 140, such as Schottky diode. In some embodiments, the current spread layer 128 is a fourth doped region in the drift layer 104. Heterojunctions 142A, 142B, 142C are defined at the interfaces between the first doped region 134, the second doped region 136, the third doped region 138, and the material of the drift layer 104, respectively. The characteristics of the heterojunctions 142A, 142B, 142C vary depending on the dopant profiles of the first doped region 134, the second doped region 136, and the third doped region 138. The top side conductive layer 130 and the back side conductive layer 132 provide terminals of the diode 140.

In some embodiments, the blocking layer 202 of FIG. 2C or the dielectric layer 302 of FIG. 3C may be provided in the device 100 of FIG. 5B.

Figure 6:
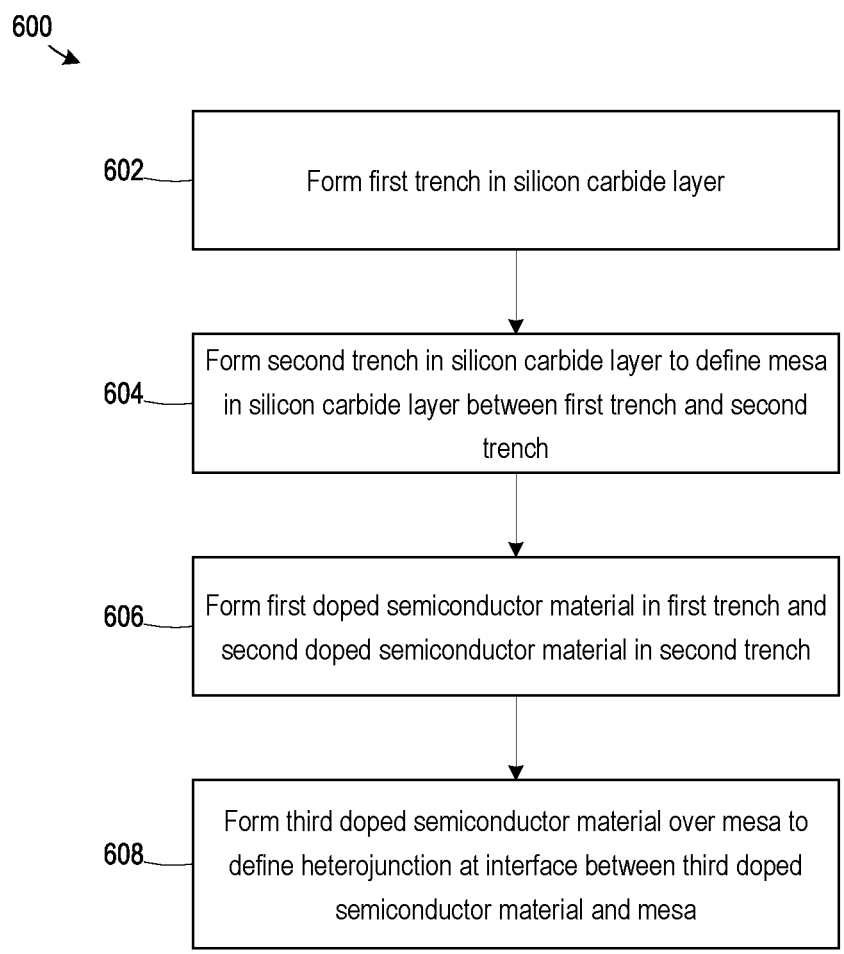
FIG. 6 is an illustration of an example method in accordance with the techniques presented herein.

FIG. 6 is an illustration of an example method 600 for manufacturing a semiconductor device. At 602, a first trench is formed in a silicon carbide layer. At 604, a second trench is formed in the silicon carbide layer to define a mesa in the silicon carbide layer between the first trench and the second trench. At 606, a first doped semiconductor material is formed in the first trench and a second doped semiconductor material is formed in the second trench. At 608, a third doped semiconductor material is formed over the mesa to define a heterojunction at an interface between the third doped semiconductor material and the mesa.

It may be appreciated that by applying one or more of the techniques described herein, such as by forming a diode in the trenches and over the mesa, the semiconductor device may have improved performance due to the tailoring of the dopant profile. Power diodes should have the lowest possible knee voltage and a low leakage current. Diodes based on SiC are designed as Schottky diodes for reverse voltages of e.g. above 400 V (e.g., above 500 V or above 1 kV or above 2 kV). In some examples, the reverse voltage may be below 15 kV (or below 10 kV or below 6 kV or below 3.3 kV).

Providing a counter-doped shielding region in the drift zone reduces leakage current because, in blocking mode, the space-charge zones between the p-regions overlap so that the electric field at the contact is limited. Using the gradient dopant profiles described herein, the Schottky barrier can be gradually changed. Providing counter-doped material in the lower region of the trench provides a Schottky contact with high Schottky barrier at the upper region of the trench in which the electric field is higher in blocking mode. The upper region has a lower barrier and thus a lower knee stress in the forward or conducting mode of diode. In the blocking mode, the lower region has a higher Schottky barrier due to the counter-doping and thus a lower leakage current in the blocking mode. In the forward case, however, the upper region conducts the majority of the current. Hence, the diode allows a high reverse voltage at low forward resistance.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A semiconductor device, comprising:
a silicon carbide layer comprising a mesa and a first impurity having a first conductivity type;
a first doped region comprising a second impurity having the first conductivity type adjacent a first side of the mesa;
a second doped region comprising a third impurity having the first conductivity type adjacent a second side of the mesa;
a third doped region comprising a fourth impurity having the first conductivity type over the mesa;
a first heterojunction defined at a first interface between the first doped region and the mesa;
a second heterojunction defined at a second interface between the second doped region and the mesa; and
a third heterojunction defined at a third interface between the third doped region and the mesa.

2. The semiconductor device of claim 1, wherein:
the third doped region is over at least one of the first doped region or the second doped region.

3. The semiconductor device of claim 1, wherein the third doped region comprises:
a first portion adjacent the first side of the mesa;
a second portion adjacent the second side of the mesa; and
a third portion over the first doped region, the second doped region, and the mesa.

4. The semiconductor device of claim 3, comprising:
a first conductive contact contacting the first doped region and the first portion of the third doped region; and
a second conductive contact contacting the second doped region and the second portion of the third doped region.

5. The semiconductor device of claim 4, comprising:
a conductive layer over the third doped region and contacting the first conductive contact and the second conductive contact.

6. The semiconductor device of claim 1, wherein:
at least one of the first doped region, the second doped region, or the third doped region has a doping profile that varies in a vertical direction.

7. The semiconductor device of claim 1, comprising:
a fourth doped region in the silicon carbide layer under the first doped region, the second doped region, and the third doped region, wherein:
the fourth doped region comprises a fifth impurity having the first conductivity type.

8. The semiconductor device of claim 1 comprising:
a first dielectric region under the first doped region; and
a second dielectric region under the second doped region, wherein:
the silicon carbide layer is between the first dielectric region and the second dielectric region.

9. The semiconductor device of claim 1, comprising:
a fourth doped region in the silicon carbide layer under and directly contacting the first doped region; and
a fifth doped region in the silicon carbide layer under and directly contacting the second doped region, wherein:
the fourth doped region comprises a fifth impurity having a second conductivity type opposite the first conductivity type; and
the fifth doped region comprises a sixth impurity having the second conductivity type.

10. The semiconductor device of claim 1, wherein:
the first doped region has a first impurity concentration, and
the second doped region has a second impurity concentration greater than the first impurity concentration.

11. A semiconductor device, comprising:
a first layer comprising a first material having a first band gap and a first impurity having a first conductivity type and comprising a mesa;
a first region adjacent a first side of the mesa and having a first material composition different than a second material composition of the first layer and comprising a second impurity having the first conductivity type;
a second region adjacent a second side of the mesa and having a third material composition different than the second material composition of the first layer and comprising a third impurity having the first conductivity type;
a second layer comprising a second material having a second band gap less than the first band gap over the first layer and comprising a fourth impurity having the first conductivity type;
a first heterojunction defined at a first interface between the first region and the mesa;
a second heterojunction defined at a second interface between the second region and the mesa; and
a third heterojunction defined at an interface between the first layer and the second layer.

12. The semiconductor device of claim 11, wherein:
the first region has a third band gap less than the first band gap; and
the second region has a fourth band gap less than the first band gap.

13. The semiconductor device of claim 11, comprising:
a first dielectric layer between the first region and the first layer; and
a second dielectric layer between the second region and the first layer.

14. The semiconductor device of claim 11, comprising:
a third region in the first layer under and directly contacting the first region; and
a fourth region in the first layer under and directly contacting the second region, wherein:
the third region comprises a fifth impurity having a second conductivity type opposite the first conductivity type; and
the fourth region comprises a sixth impurity having the second conductivity type.

15. The semiconductor device of claim 11, comprising:
a first conductive contact contacting the first region and the second layer; and
a second conductive contact contacting the second region and the second layer.

16. A method for forming a semiconductor device, comprising:
forming a first trench in a silicon carbide layer comprising a first impurity having a first conductivity type;
forming a second trench in the silicon carbide layer to define a mesa in the silicon carbide layer between the first trench and the second trench;
forming a first doped semiconductor material comprising a second impurity having the first conductivity type in the first trench to define a first heterojunction at a first interface between the first doped semiconductor material and the mesa;
forming a second doped semiconductor material comprising a third impurity having the first conductivity type in the second trench to define a second heterojunction at a second interface between the second doped semiconductor material and the mesa; and
forming a third doped semiconductor material comprising a fourth impurity having the first conductivity type over the mesa to define a third heterojunction at a third interface between the third doped semiconductor material and the mesa.

17. The method of claim 16, comprising:
forming a first conductive contact contacting the first doped semiconductor material and the third doped semiconductor material; and
forming a second conductive contact contacting the second doped semiconductor material and the third doped semiconductor material.

18. The method of claim 17, wherein:
a first cavity exposes the first doped semiconductor material and the third doped semiconductor material;
a second cavity exposes the second doped semiconductor material and the third doped semiconductor material; and
forming the first conductive contact and the second conductive contact comprises forming a conductive barrier layer in the first cavity and in the second cavity.

19. The method of claim 16, comprising:
implanting an impurity having the first conductivity type in a first region under the first trench and in a second region under the second trench.

20. The method of claim 16, wherein at least one of first doped semiconductor material, the second doped semiconductor material, or the third doped semiconductor material has a doping profile that varies in a vertical direction.

21. The method of claim 16, comprising:
forming a first dielectric layer in a bottom portion of the first trench; and
forming a second dielectric layer in a bottom portion of the second trench.

* * * * *